United States Patent
Taniguchi

(10) Patent No.: US 9,330,978 B2
(45) Date of Patent: May 3, 2016

(54) SEMICONDUCTOR DEVICE

(75) Inventor: Koji Taniguchi, Tokyo (JP)

(73) Assignee: PS4 Luxco S.a.r.l., Luxembourg (LU)

(*) Notice: Subject to any disclaimer, the term of this patent is extended or adjusted under 35 U.S.C. 154(b) by 0 days.

(21) Appl. No.: 13/253,390

(22) Filed: Oct. 5, 2011

(65) Prior Publication Data
US 2012/0086060 A1    Apr. 12, 2012

(30) Foreign Application Priority Data

Oct. 7, 2010   (JP) ................................ 2010-227908

(51) Int. Cl.
| H01L 29/78 | (2006.01) |
| H01L 27/06 | (2006.01) |
| H01L 21/8234 | (2006.01) |
| H01L 21/762 | (2006.01) |
| H01L 27/108 | (2006.01) |
| H01L 29/10 | (2006.01) |

(52) U.S. Cl.
CPC .. H01L 21/823437 (2013.01); H01L 21/76232 (2013.01); H01L 27/10814 (2013.01); H01L 27/10876 (2013.01); H01L 29/1083 (2013.01); H01L 29/7813 (2013.01)

(58) Field of Classification Search
CPC ............ H01L 27/10864; H01L 27/1087; H01L 29/1083; H01L 27/10876; H01L 29/7813; H01L 29/66734; H01L 29/41766; H01L 29/4236; H01L 29/7811; H01L 29/7816; H01L 29/7825
USPC ............................................. 257/E21.41, 330
See application file for complete search history.

(56) References Cited

U.S. PATENT DOCUMENTS

| 5,798,544 | A | 8/1998 | Ohya et al. | |
| 7,465,637 | B2* | 12/2008 | Yamazaki | 438/306 |
| 7,807,536 | B2* | 10/2010 | Sreekantham et al. | 438/270 |
| 7,902,598 | B2 | 3/2011 | Juengling | |
| 8,263,460 | B2* | 9/2012 | Kim | 438/270 |
| 8,288,810 | B2* | 10/2012 | Arao | 257/296 |
| 2003/0234433 | A1 | 12/2003 | Tran | |
| 2005/0024961 | A1* | 2/2005 | Ding | 365/202 |
| 2006/0289919 | A1 | 12/2006 | Juengling | |
| 2007/0007571 | A1* | 1/2007 | Lindsay et al. | 257/306 |
| 2011/0133270 | A1 | 6/2011 | Juengling | |
| 2011/0248339 | A1* | 10/2011 | Kim | 257/331 |
| 2012/0074518 | A1* | 3/2012 | Kim et al. | 257/506 |
| 2013/0248958 | A1 | 9/2013 | Juengling | |

FOREIGN PATENT DOCUMENTS

| JP | H7-297297 A | 11/1995 |
| JP | 2007-180150 A | 7/2007 |
| JP | 2008-547228 A | 12/2008 |
| WO | 2007/002117 A2 | 1/2007 |
| WO | 2007/002117 A3 | 1/2007 |

* cited by examiner

Primary Examiner — Tom Thomas
Assistant Examiner — John Bodnar

(57) ABSTRACT

A semiconductor device includes a semiconductor substrate, a gate electrode, a dummy gate electrode, and a first impurity diffusion region. The semiconductor substrate has first and second grooves. The gate electrode is in the first groove. The dummy gate electrode is in the second groove. The dummy gate electrode has a first top surface. The first impurity diffusion region in the semiconductor substrate is positioned between the first and second grooves. The first top surface is positioned at a lower level than a bottom of the first impurity diffusion region.

20 Claims, 20 Drawing Sheets

SEMICONDUCTOR DEVICE

BACKGROUND OF THE INVENTION

1. Field of the Invention

The present invention generally relates to a semiconductor device and a method of forming the same.

Priority is claimed on Japanese Patent Application No. 2010-227908, filed Oct. 7, 2010, the content of which is incorporated herein by reference.

2. Description of the Related Art

Recent years, the gate length of a MOS (Metal Oxide Semiconductor) transistor has been reduced in accordance with rapid miniaturization of elements such as a DRAM (Dynamic Random Access Memory). Also, the distance between the adjacent MOS transistors has been reduced by integrating a lot of MOS transistors in a memory cell region. The short gate length may cause a deterioration of transistor properties by a short-channel effect of the MOS transistor.

Japanese Unexamined Patent Application, First Publication, No. JP-A-2007-180150 discloses a buried-gate MOS transistor which is one measure for suppressing the short-channel effect of the MOS transistor. The buried-gate MOS transistor sufficiently secures an effective channel length (gate length) physically. Therefore, the buried-gate MOS transistor can realize a miniaturized DRAM. Since the buried-gate MOS transistor is suitable for high-integration, it is considered that the buried-gate MOS transistor is used as a cell transistor of the DRAM.

SUMMARY

In one embodiment, a semiconductor device may include, but is not limited to, a semiconductor substrate, a gate electrode, a dummy gate electrode, and a first impurity diffusion region. The semiconductor substrate has first and second grooves. The gate electrode is in the first groove. The dummy gate electrode is in the second groove. The dummy gate electrode has a first top surface. The first impurity diffusion region in the semiconductor substrate is positioned between the first and second grooves. The first top surface is lower in level than a bottom of the first impurity diffusion region.

In another embodiment, a semiconductor device may include, but is not limited to, a semiconductor substrate, a first transistor, a second transistor, and first and second dummy gate electrodes. The first transistor includes a first gate electrode and first and second impurity diffusion layers. The first gate electrode is buried in the semiconductor substrate. The second transistor includes a second gate electrode, the second impurity diffusion layer, and a third impurity diffusion layer. The second gate electrode is buried in the semiconductor substrate. The first and second dummy gate electrodes are buried in the semiconductor substrate. The first and second dummy gate electrodes are adjacent to the first and third diffusion layers, respectively. The first and second gate electrodes are interposed between the first and second dummy gate electrodes. A top surface of the first dummy gate electrode is positioned at a lower level than a bottom of the first impurity diffusion layer. A top surface of the second dummy gate electrode is lower in level than a bottom of the third impurity diffusion layer.

In still another embodiment, a semiconductor device may include, but is not limited to, a first transistor, a second transistor, a dummy gate electrode. The first transistor includes a first gate electrode and a first impurity diffusion layer. The second transistor includes a second gate electrode. The dummy gate electrode is disposed between the first and second transistors. The first impurity diffusion layer is disposed between the first gate electrode and the dummy gate electrode. A top surface of the dummy gate electrode is lower in level than a bottom of the first impurity diffusion layer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in order to facilitate understanding the present invention.

An example of a DRAM (semiconductor device) 110 provided with a buried gate MOS transistor 102 in the related art will be explained with reference to FIGS. 27 and 28.

Figure 27:
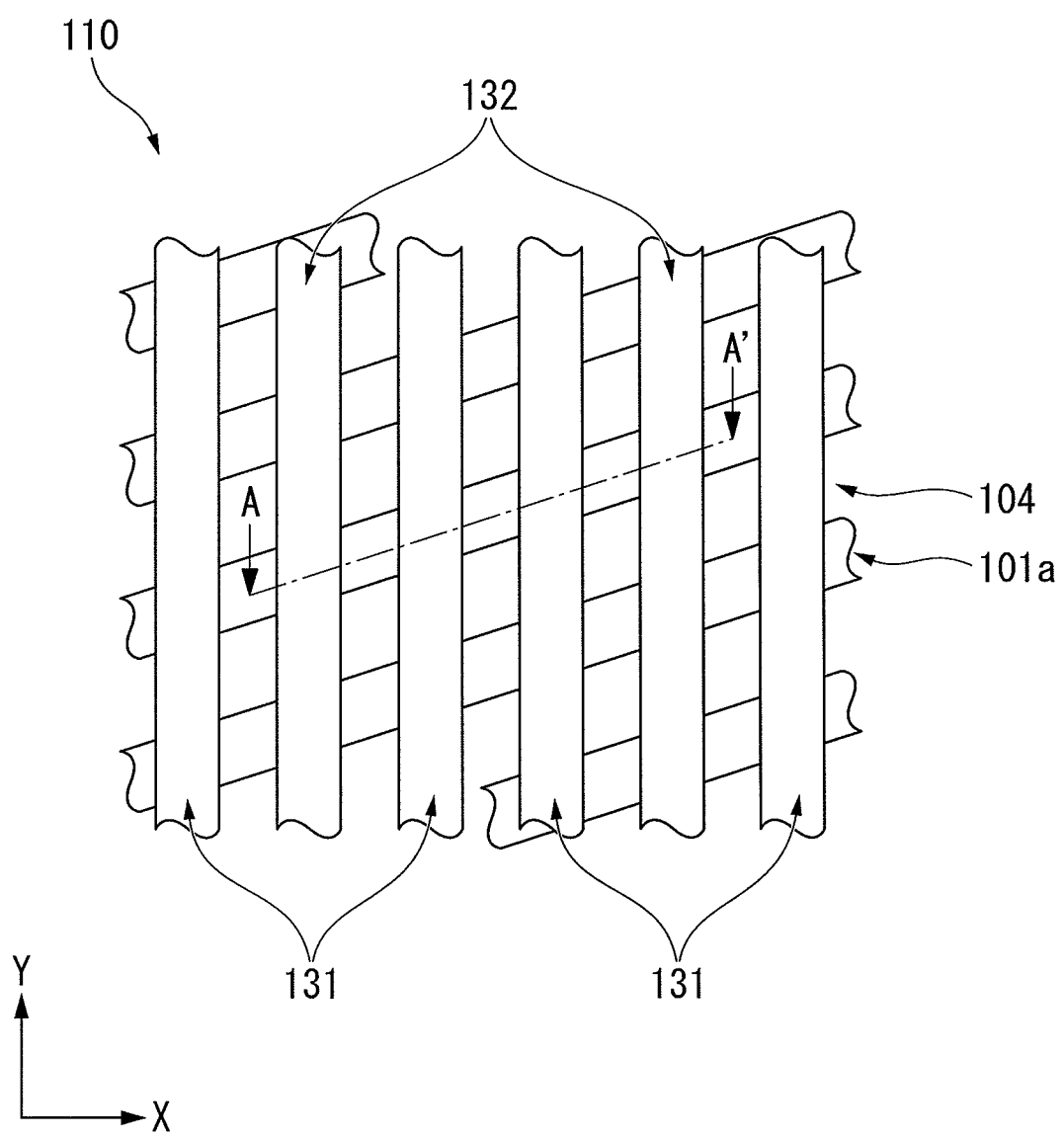
FIG. 27 is a fragmentary plan view illustrating a semiconductor device in accordance with the related art.

As shown in FIG. 27, a memory cell region of the semiconductor device 110 includes isolation regions 104 which are formed in a line-shape and extend in an X-direction. The isolation regions 104 are made of an insulator. Active regions 101a defined by the isolation regions 104 are formed in line-shape at a predetermined interval.

Gate electrodes 131 which function as word lines and dummy gate electrodes 132 for isolating elements (an isolation region) 132 are formed at a predetermined interval. The gate electrodes 131 and the dummy gate electrodes 132 cross the active regions 101a and extend in a Y-direction. The gate electrodes 131 and the dummy gate electrodes 132 are formed in the same steps.

Figure 28:
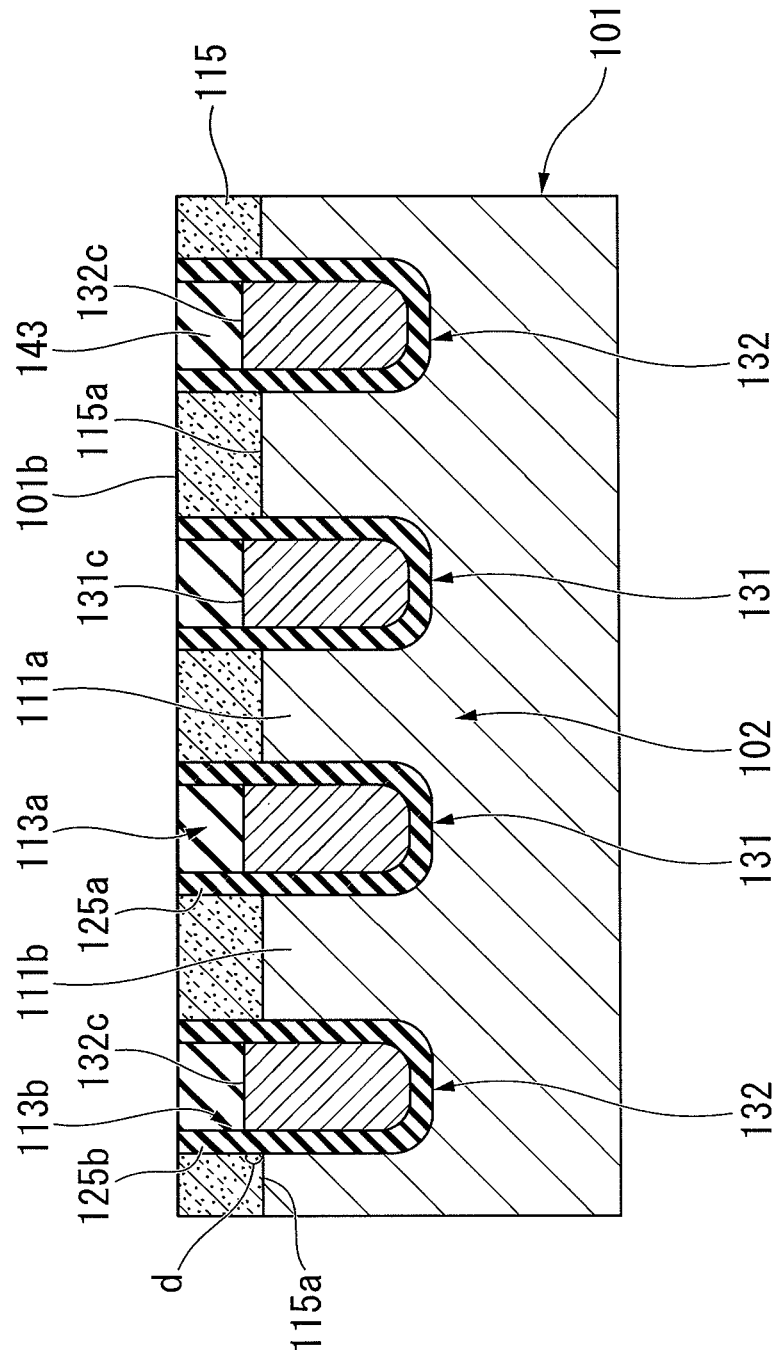
FIG. 28 is a fragmentary cross sectional elevation view, taken along a A-A' line of FIG. 27, illustrating the semiconductor device in a step involved in a method of forming the semiconductor device in accordance with the related art.

FIG. 28 is a fragmentary cross sectional elevation view, taken along a A-A' line of FIG. 27, illustrating the buried gate MOS transistor 102 in a step involved in a method of forming the semiconductor device in accordance with the related art.

As shown in FIG. 28, the buried gate MOS transistor 102 includes a p-type semiconductor substrate 101, n-type impurity diffusion layers 115, and gate electrodes 131.

The n-type impurity diffusion layers 115 are positioned on a first region 111a and on a second region 111b. The first region 111a is positioned between the adjacent gate electrodes 131. The second region 111b is positioned between the gate electrode 131 and the dummy gate electrode (isolation region) 132.

The gate electrode 131 includes a first conductive film buried in a first groove 113a while a first gate insulating film 125a is interposed between the gate electrode 131 and a surface of the first groove 113a.

The dummy gate electrode (isolation region) 132 includes a second conductive film buried in a second groove 113b while a second gate insulating film 125b is interposed between the dummy gate electrode 132 and a surface of the second groove 113b.

The top surface 131c of the gate electrode 131 and the top surface 132c of the dummy gate electrode 132 are positioned lower in level than the top surface 101b of the semiconductor substrate 101. Since the gate electrode 131 and the dummy gate electrode 132 are formed in the same steps, the top surfaces 131c and 132c have the same level.

A cap insulating films 143 are formed on the top surface 131c inside the first groove 113a and on the top surface 132c inside the second groove 113b. A bit line (not shown) is connected to a surface of the n-type impurity diffusion layer 115 between the adjacent gate electrodes 131 while an interlayer insulating film (not shown) is interposed between the bit line and the n-type impurity diffusion layer 115. A capacitor for information storage (not shown) is connected to the surface of the n-type impurity diffusion layer 115 between the gate electrode 131 and the dummy gate electrode 132.

When a memory cell operates, a channel is formed in the vicinity of a surface of the semiconductor substrate in the first groove 113a by applying a first voltage to the gate electrode 131, thereby turning the MOS transistor 102 on. A second voltage opposite in polarity to the first voltage is applied to the dummy gate electrode 132 so as not to form a channel in the vicinity of a surface of the semiconductor substrate in the second groove 113b. When applying the second voltage, a short-circuit between the n-type impurity diffusion layers 115 can be suppressed since the channel is not formed in the vicinity of the surface of the semiconductor substrate. The n-type impurity diffusion layers 115 are adjacently positioned while the dummy gate electrode 132 is interposed between the n-type impurity diffusion layers 115.

The dummy gate electrode 132 functions as a region for isolating the MOS transistors 102. The MOS transistors 102 are adjacently positioned while the dummy gate electrode 132 is interposed between the MOS transistors 102.

In the memory cell having the structure described above, a lower surface 115a of the n-type impurity diffusion layer 115 which is a junction position is positioned at a lower level than the top surface 131c of the gate electrode 131 and the top surface 132c of the dummy gate electrode 132. A side surface of the n-type impurity diffusion layer 115 and a side surface of the dummy gate electrode 132 are adjacently positioned to overlap each other at a region d while the gate insulating film 125 is interposed between the diffusion layer 115 and the dummy gate electrode 132. Therefore, the electric field intensity in the region d is strong since the voltage opposite in polarity to the voltage with which the gate electrode 131 is applied is applied to the dummy gate electrode 132, thereby generating a junction leak current. Charge information stored in the capacitor leaks, thereby deteriorating information storing properties of the DRAM.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate, a gate electrode, a dummy gate electrode, and a first impurity diffusion region. The semiconductor substrate has first and second grooves. The gate electrode is in the first groove. The dummy gate electrode is in the second groove. The dummy gate electrode has a first top surface. The first impurity diffusion region in the semiconductor substrate is positioned between the first and second grooves. The first top surface is positioned at a lower level than a bottom of the first impurity diffusion region.

In some cases, the semiconductor device may include, but is not limited to, the bottom of the first impurity diffusion layer having a p-n junction with the semiconductor substrate.

In some cases, the semiconductor device may include, but is not limited to, the gate electrode has a second top surface. The second top surface is positioned at a higher level than the bottom of the first impurity diffusion layer.

In some cases, the semiconductor device may include, but is not limited to, the first top surface being positioned at level that is at least 20 nm lower than the bottom of the first impurity diffusion layer.

In some cases, the semiconductor device may further include, but is not limited to, a second impurity diffusion layer adjacent to the first groove and in the semiconductor substrate.

In some cases, the semiconductor device may further include, but is not limited to, a bit line coupled to the second impurity diffusion layer.

In some cases, the semiconductor device may include, but is not limited to, the gate electrode configured to be applied with a first voltage. The dummy gate electrode is configured to be applied with a second voltage opposite in polarity to the first voltage.

In some cases, the semiconductor device may further include, but is not limited to, a capacitor coupled to the first impurity diffusion layer.

In another embodiment, a semiconductor device may include, but is not limited to, a semiconductor substrate, a first transistor, a second transistor, and first and second dummy gate electrodes. The first transistor includes a first gate electrode and first and second impurity diffusion layers. The first gate electrode is buried in the semiconductor substrate. The second transistor includes a second gate electrode, the second impurity diffusion layer, and a third impurity diffusion layer. The second gate electrode is buried in the semiconductor substrate. The first and second dummy gate electrodes are buried in the semiconductor substrate. The first and second dummy gate electrodes are adjacent to the first and third diffusion layers, respectively. The first and second gate electrodes are interposed between the first and second dummy gate electrodes. A top surface of the first dummy gate electrode is positioned at a lower level than a bottom of the first impurity diffusion layer. A top surface of the second dummy gate electrode is positioned at a lower level a bottom of the third impurity diffusion layer.

In some cases, the semiconductor device may include, but is not limited to, the bottom of the first impurity diffusion layer and the bottom of the second impurity diffusion layer having p-n junctions with the semiconductor substrate.

In some cases, the semiconductor device may include, but is not limited to, a top surface of the first gate electrode being positioned at a higher level than the bottom of the first impurity diffusion layer, and a top surface of the second gate electrode being positioned at a higher level than the bottom of the third impurity diffusion layer.

In some cases, the semiconductor device may include, but is not limited to, the top surface of the first dummy gate electrode being positioned at level that is at least 20 nm lower than the bottom of the first impurity diffusion layer and the top surface of the second dummy gate electrode being positioned at level that is at least 20 nm lower than the bottom of the third impurity diffusion layer.

In some cases, the semiconductor device may further include, but is not limited to, a bit line coupled to the second impurity diffusion layer.

In some cases, the semiconductor device may further include, but is not limited to, a first capacitor coupled to the first impurity diffusion layer and a second capacitor coupled to the third impurity diffusion layer.

In some cases, the semiconductor device may include, but is not limited to, the gate electrode configured to be applied with a first voltage. The dummy gate electrode is configured to be applied with a second voltage opposite in polarity to the first voltage.

In still another embodiment, a semiconductor device may include, but is not limited to, a first transistor, a second transistor, a dummy gate electrode. The first transistor includes a first gate electrode and a first impurity diffusion layer. The second transistor includes a second gate electrode. The dummy gate electrode is disposed between the first and second transistors. The first impurity diffusion layer is disposed between the first gate electrode and the dummy gate electrode. A top surface of the dummy gate electrode is positioned at a lower level than a bottom of the first impurity diffusion layer.

In some cases, the semiconductor device may include, but is not limited to, a top surface of the first gate electrode being positioned at a higher level than the bottom of the first impurity diffusion layer.

In some cases, the semiconductor device may include, but is not limited to, the top surface of the dummy gate electrode being at level that is at least 20 nm lower than the bottom of the first impurity diffusion layer.

In some cases, the second transistor may further include, but is not limited to, a second impurity diffusion layer between the second gate electrode and the dummy gate electrode. The top surface of the dummy gate electrode is positioned at a lower level than a bottom of the second impurity diffusion layer.

In some cases, the semiconductor device may further include, but is not limited to, an insulator on the dummy gate electrode. The insulator electrically isolates the first and second transistors.

In yet another embodiment, a method of forming a semiconductor device may include, but is not limited to, the following processes. A first conductivity type impurity is introduced into a semiconductor substrate. First and second grooves are formed in the semiconductor substrate to define an impurity diffusion region. A first conductive material is filled in the first and second grooves. The first conductive material in the first groove is etched-back until a top surface of the first conductive material in the first groove is positioned at a lower level than a bottom of the impurity diffusion region.

In some cases, the method may further include, but is not limited to, etching-back the first conductive material in the first and second grooves so that the top surface of the first conductive material in the first groove and a top surface of the first conductive material in the second groove are positioned at a higher level than the bottom of the impurity diffusion region.

In some cases, the method may further include, but is not limited to, forming a gate insulating film in the first and second grooves before filling the first conductive material.

In some cases, filling the first conductive material in the first and second grooves may further include, but is not limited to, forming a second conductive material in the first and second grooves and forming a third conductive material on the second conductive material.

In some cases, the method may further include, but is not limited to, the following processes. An amorphous carbon mask is formed to fill the first and second grooves after filling the first conductive material. A first mask is formed over the second grooves. The amorphous carbon mask is etched using the first mask as a mask.

Hereinafter, a semiconductor device according to an embodiment of the invention will be described in detail with reference to the drawings. In the present embodiment, a DRAM (Dynamic Random Access Memory) as the semiconductor device will be described. In the drawings used for the following description, to easily understand characteristics, there is a case where characteristic parts are enlarged and shown for convenience' sake, and ratios of constituent elements may not be true to scale. Materials, sizes, and the like in the following description are merely examples. The invention is not limited thereto and may be appropriately modified within a scope which does not deviate from the concept of the invention.

A DRAM (semiconductor device) 10 according to the present embodiment will be described. The semiconductor device 10 according to the present embodiment may include, but is not limited to, a memory cell region shown in FIG. 1 and a peripheral circuit region (not shown).

A memory cell included in the semiconductor device 10 will be described with reference to FIG. 1.

Figure 1:
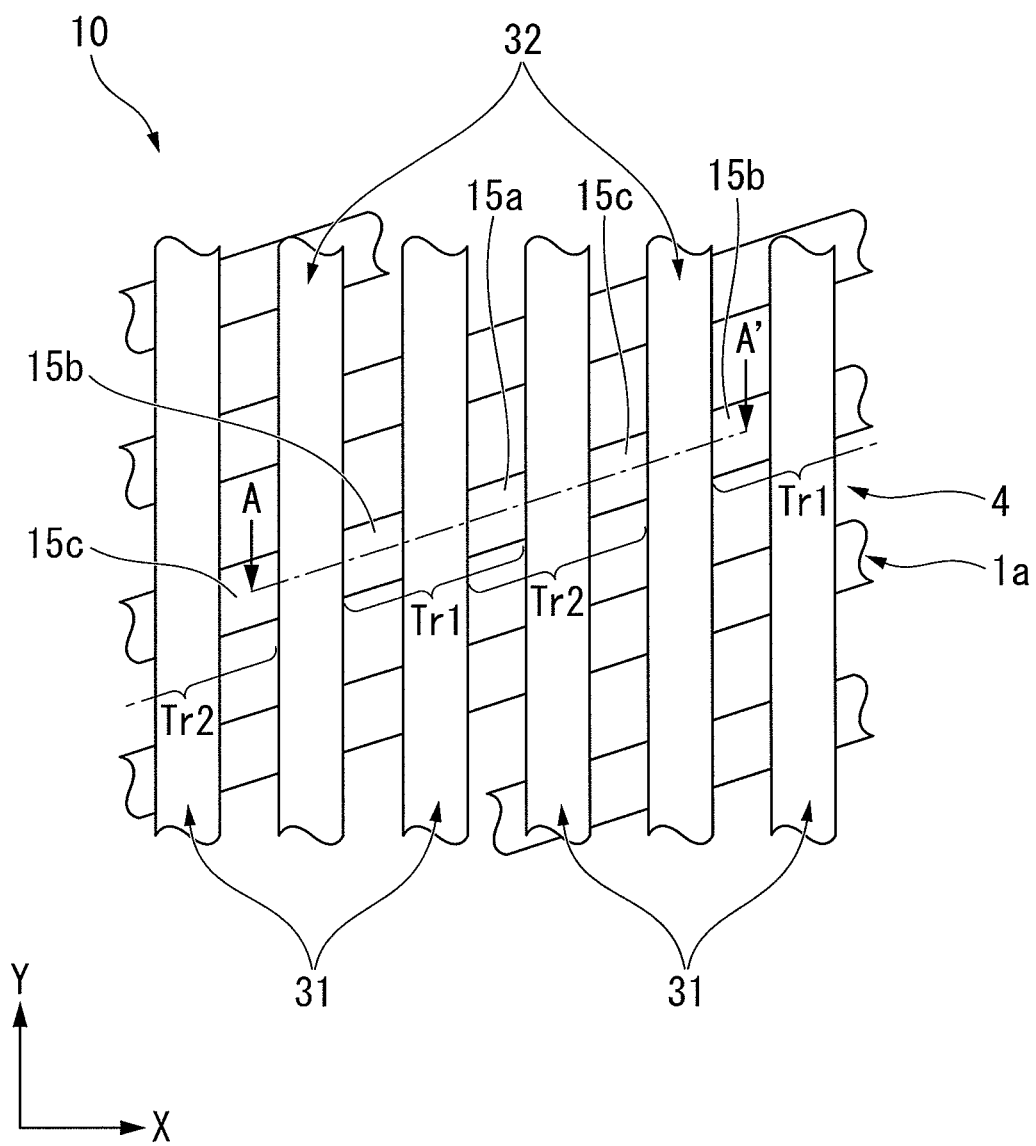
FIG. 1 is a fragmentary plan view illustrating a semiconductor device in accordance with one embodiment of the present invention.

As shown in FIG. 1, isolation regions 4 are formed in a line-shape and extend in an X-direction in the memory cell region of the semiconductor device 10. The isolation regions 104 made of an insulator are buried in, for example, STI isolation groove. A plurality of active regions 1a defined by the isolation regions 104 are formed in a line-shape at predetermined intervals. According to the present embodiment, when the minimum feature size which is an index for manufacturing techniques is F, a width of the active region 1a is F. The active regions 1a are positioned at the interval of F.

A first word line layer (gate electrode) 31 and a second word line layer (dummy gate electrode) 32 are disposed substantially at equally-spaced intervals. The first word line layer 31 functions as the gate electrode. The second word line layer 32 isolates adjacent transistors. The first word line layer 31 and the second word line layer 32 extend in a Y-direction and cross the active regions 1a. The width of the first word line layer 31 and the width of the second word line layer 32 are F. The first word line layer 31 and the second word line layer 32 are positioned at the interval of F.

Two gate electrodes 31 which are disposed adjacent to each other as a pair are provided on one active region 1a. The gate electrodes 31 function as gate electrodes of the corresponding buried gate MOS transistors (hereinafter, transistor). The active region 1a is defined by the dummy gate electrodes 32 so that the pair of gate electrodes 31 is positioned between the dummy gate electrodes 32.

A first transistor Tr1 and a second transistor Tr2 are provided in one active region 1a.

The first transistor Tr1 may include, but is not limited to, a first n-type impurity diffusion layer 15a, one of the gate electrodes 31, and a second n-type impurity diffusion layer 15b. The first n-type impurity diffusion layer 15a functions as a source region. The second n-type impurity diffusion layer 15b functions as a drain region. In the transistor Tr1, one of the dummy gate electrodes 32 is adjacently positioned on the left of the second n-type impurity diffusion layer 15b, which functions as the drain region, as shown in FIG. 1.

The second transistor Tr2 may include, but is not limited to, the first n-type impurity diffusion layer 15a, the other of the gate electrodes 31, and a third n-type impurity diffusion layer 15c. The first n-type impurity diffusion layer 15a functions as a source region. The third n-type impurity diffusion layer 15c functions as a drain region. In the transistor Tr2, the other of dummy gate electrodes 32 is adjacently positioned on the right of the third n-type impurity diffusion layer 15c, which functions as the drain region, as shown in FIG. 1.

Capacitors 8 are connected to the upper surface of the second n-type impurity diffusion layer 15b of the first transistor Tr1 and to upper surface of the third n-type impurity diffusion layer 15c of the second transistor Tr2, respectively.

The first n-type impurity diffusion layer 15a which functions as the source region is provided in the active region 1a between the pair of the gate electrodes 31. The first n-type impurity diffusion layer 15a is a common diffusion layer among the first transistor Tr1 and the second transistor Tr2. A bit line 51 is connected to an upper surface of the first n-type impurity diffusion layer 15a which functions as the source region.

The source region and the drain region described above are decided expediently; however, the source region may be the drain region and the drain region may be the source region depending on the operation state.

By the structure described above, the adjacent transistors are electrically isolated by maintaining the dummy gate electrode 32 to have a predetermined potential. For example, in the case of the dummy gate electrode 32 on the left in FIG. 1, the dummy gate electrode 32 prevents a short-circuit between the second n-type impurity diffusion layer 15b of the first transistor Tr1 on the right of the dummy gate electrode 32 and the third n-type impurity diffusion layer 15c of the second transistor Tr2 on the left of the dummy gate electrode 32.

In the case where the transistor is an n-channel transistor, a negative bias is applied to the dummy gate electrode 32. In the case where the transistor is a p-channel transistor, a positive bias is applied to the dummy gate electrode 32.

Although not shown in FIG. 1, the plurality of bit lines 51, which will be described later, cross the gate electrodes 31 and the dummy gate electrodes 32 substantially at a right angle. The bit lines 51 extend in an X-direction as shown in FIG. 1 and are positioned at predetermined intervals.

The plurality memory cells are provided in the memory cell region. The memory cells are provided with the capacitors (not shown).

According to the semiconductor device 10 of the present embodiment, one memory cell is arranged in a region with a width of 3F in the X-direction and a width of 2F in the Y-direction. That is, one memory cell has an area of $6F^2$ (3F×2F). F is the minimum feature size as described above.

The memory cell included in the semiconductor device 10 according to the present embodiment will be described.

Figure 2:
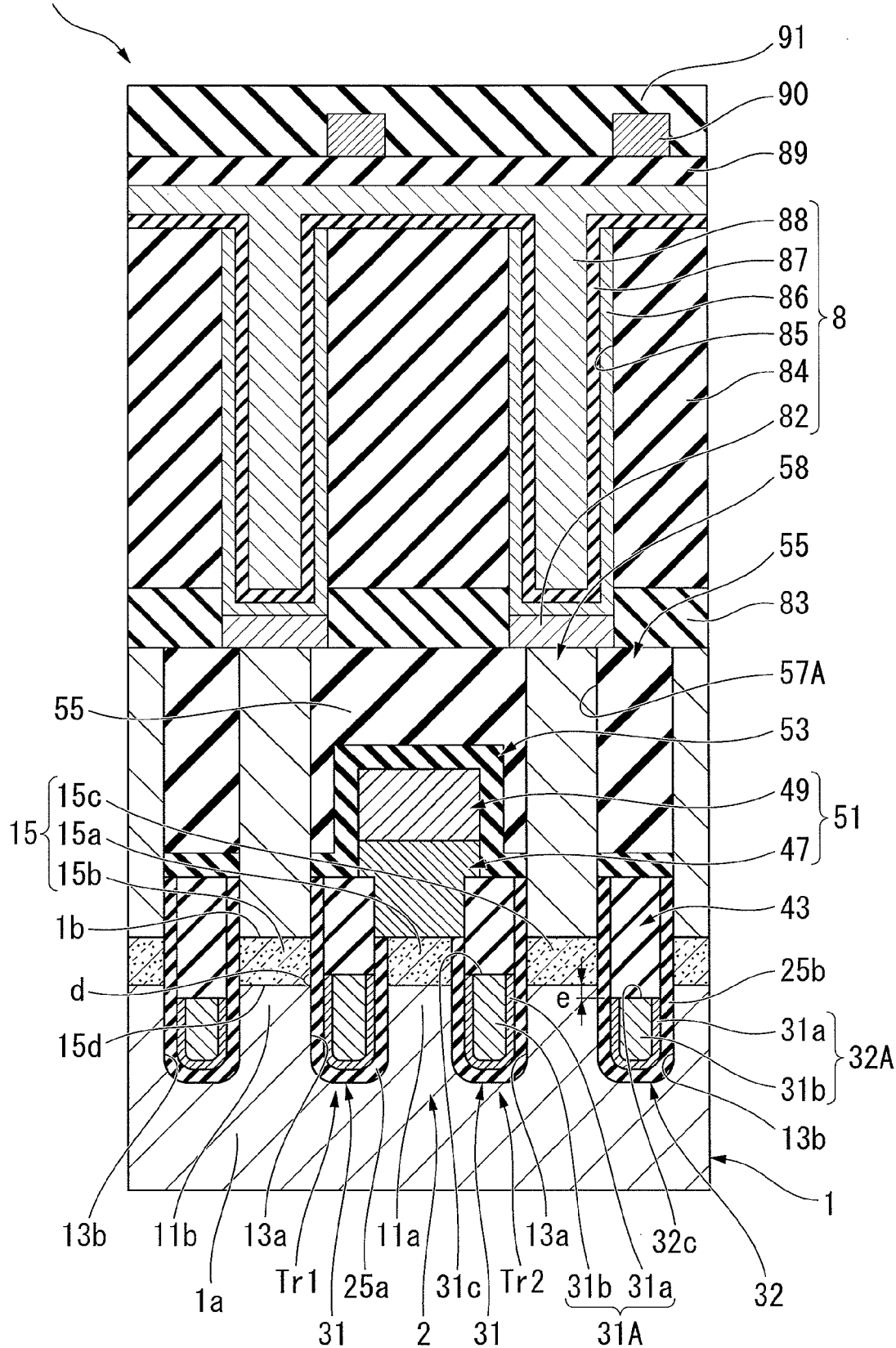
FIG. 2 is a fragmentary cross sectional elevation view illustrating the semiconductor device in accordance with one embodiment of the present invention.

As shown in FIG. 2, the memory cell according to the present embodiment may include, but is not limited to, a transistor 2 including the first and second transistors Tr1 and Tr2, a capacitor 8, and a wiring layer 90. The memory cell has a stacked structure including the transistor 2, the capacitor 8, and the wiring layer 90. The structure of each element will be described below.

The transistor 2 may include, but is not limited to, the n-type impurity diffusion layer 15 and the gate electrode 31. The n-type impurity diffusion layer 15 is formed in the active region 1a of a semiconductor substrate 1 in a depth direction from a surface of the active region 1a.

The semiconductor substrate 1 may include, for example, p-type single crystalline silicon. The active region 1a defined by the isolation region 4 illustrated in FIG. 1 is formed in the semiconductor substrate 1.

A first groove 13a and a second groove 13b for buried gate electrodes are formed in a surface layer of the semiconductor substrate 1 at a predetermined interval (F). The first and second grooves 13a and 13b cross the plurality of active regions 1a and extend in the Y-direction as shown in FIG. 1. The first groove 13a is provided to form the gate electrode 31 which functions as a gate electrode of the transistor 2. The second groove 13b is provided to form the dummy gate electrode 32. According to the present embodiment, the second grooves 13b are separated intermittently by the two first grooves 13a.

The active region 1a is defined at equally-spaced intervals (F) by the first and second grooves 13a and 13b.

The active region 1a includes a first region 11a and a second region 11b. The first region 11a is positioned between the adjacent first grooves 13a. The second region 11b is positioned between the first groove 13a and the second groove 13b adjacent to the first groove 13a.

The n-type impurity diffusion layer 15 is a region where an n-type impurity element (ion) such as phosphorus is introduced in the depth direction from the surface layer of the active region 1a. The concentration of the n-type impurity element in the n-type impurity diffusion layer 15 is approximately $1.0 \times 10^{13}$ atoms/cm$^2$, for example. The n-type impurity diffusion layer 15 functions as one of the source region and the drain region of the transistor 2.

A bottom of the n-type impurity diffusion layer 15 is defined as a junction position 15d. Since the n-type impurity diffusion layer 15 is formed by introducing the n-type impurity element into the semiconductor substrate 1 including the p-type impurity element, the bottom of the n-type impurity diffusion layer 15, that is, the boundary between the n-type impurity diffusion layer 15 and a p-type impurity region of the semiconductor substrate 1 corresponds to a P—N junction position.

The n-type impurity diffusion layer 15 disposed between the adjacent first grooves 13a is referred to as the first n-type impurity diffusion layer 15a which is the source region in FIG. 1. The n-type impurity diffusion layer 15 disposed between the first groove 13a and the second groove 13b in the first transistor Tr1 is referred to as the second n-type impurity diffusion layer 15b which is the drain region in FIG. 1. The n-type impurity diffusion layer 15 disposed between the first groove 13a and the second groove 13b in the second transistor Tr2 is referred to as the third n-type impurity diffusion layer 15c which is the drain region in FIG. 1.

The gate electrode 31 functions as the gate electrode of the transistor 2. According to the present embodiment, two gate electrodes 31 which are disposed adjacent to each other as a pair operate as the gate electrodes of the first transistor Tr1 and second transistor Tr2, respectively.

The gate electrode 31 is formed of a first conductive layer 31A which is buried in the first groove 13a. The first gate insulating film 25a is interposed between the first conductive layer 31A and the surface of the first groove 13a.

The transistor 2 illustrated in FIG. 2 includes the first and second transistors Tr1 and Tr2 in plan view in FIG. 1. The first transistor Tr1 may include, but is not limited to, the source region which is the first n-type impurity diffusion layer 15a, the gate electrode 31, and the drain region which is the second n-type impurity diffusion layer 15b.

The second transistor Tr2 may include, but is not limited to, the source region which is the first n-type impurity diffusion layer 15a, the gate electrode 31, and the drain region which is the third n-type impurity diffusion layer 15c. The first n-type impurity diffusion layer 15a is a common diffusion layer among the first transistor Tr1 and the second transistor Tr2.

The first gate insulating film 25a may be, for example, a silicon oxide film with a thickness of 4 nm. The first gate insulating film 25a covers an inner surface of the first groove 13a with which the active region 1a of the semiconductor substrate 1 is provided. The first conductive layer 31A may include, but is not limited to, a first conductive material 31a and a second conductive material 31b. The first conductive material 31a may include, but is not limited to, a titanium nitride film, for example. The first conductive material may be the titanium nitride film. The second conductive material 31b may include, but is not limited to, a tungsten film, for example. The first conductive material may be the tungsten film.

The first conductive material 31a covers a portion of a surface of the first gate insulating film 25a. The second conductive material 31b buries a depression of the conductive material 31a. A top surface of the first conductive material 31a is aligned with a top surface of the second conductive material 31b. The top surface of the first conductive material 31a and the second conductive material 31b form a top surface 31c of the first conductive layer 31A (gate electrode 31). In the case of using the titanium nitride film as the first conductive material 31a, the first conductive material 31a which is in contact with the first gate insulating film 25a controls a threshold voltage of the transistor 2. In the case of using the tungsten film as the second conductive material 31b, the second conductive material 31b contributes to a reduction of a resistivity of the word line layer 31 (gate electrode 31).

The dummy gate electrode 32 electrically isolates the adjacent transistors 2. The dummy gate electrode 32 is formed of the second conductive layer 32A which is buried in the second groove 13b formed in the semiconductor substrate 1. The second gate insulating film 25b is interposed between the second conductive layer 32A and a surface of the second groove 13b. The second gate insulating film 25b is formed in the same steps as the first gate insulating film 25a and by using the same material. The second gate insulating film 25b covers an inner surface of the second groove 13b.

The second conductive layer 32A may include, but is not limited to, the first conductive material 31a and the second conductive material 31b as with the first conductive layer 31A. The first conductive material 31a covers a portion of a surface of the second gate insulating film 25b. The second conductive material 31b buries a depression of the conductive material 31a. The top surface of the first conductive material 31a is aligned with the top surface of the second conductive material 31b. The top surface of the first conductive material 31a and the top surface of the second conductive material 31b form a top surface 32c of the second conductive layer 32A (dummy gate electrode 32).

According to the present embodiment, each of the first conductive layer 31A and the second conductive layer 32A is the lamination of metal films. The metal films (first and second conductive layer materials 31a and 31b) are not limited to the titanium nitride film and the tungsten film. A metal film can be used as the first conductive material 31a as long as the metal film has barrier properties such that the metal film does not react with the gate insulating film (the first and second gate insulating film 25a and 25b), and is capable of controlling the threshold voltage of the transistor 2. Also, a metal film can be used as the second conductive material 31b as long as the metal film contributes to the reduction of resistivity of the first and second conductive layers 31A and 32A.

The top surface 31c of the gate electrode 31 and the top surface 32c of the dummy gate electrode 32 are at a lower level than the top surface 1b of the semiconductor substrate 1.

The top surface 32c of the dummy gate electrode 32 is at a lower level than the junction position 15d of the n-type impurity diffusion layer 15. The top surface 32c is separated from the junction position 15d by a length e in a depth direction. Due to this structure, a side surface of the dummy gate electrode 32 does not face a side surface of the n-type impurity diffusion layer 15 while the second gate insulating film 25b is interposed between the dummy gate electrode 32 and the n-type impurity diffusion layer 15. It is preferable that the top surface 32c is formed at level that is at least 20 nm lower than the junction position 15d.

The top surface 31c of the gate electrode 31 is positioned substantially at the same level as the junction position 15d in the depth direction from the top surface 1b of the semiconductor substrate 1. It is preferable that the top surface 31c of the gate electrode 31 is higher in level than the junction position 15d. When the top surface 31c is at a higher level than the junction position 15d, a side surface of the gate electrode 31 faces the side surface of the n-type impurity diffusion layer 15 in a region d while the first gate insulating film 25a is interposed between the gate electrode 31 and the n-type impurity diffusion layer 15.

By this structure, when an electric voltage that is greater than the threshold voltage is applied to the gate electrode 31, the channel is reliably connected to the n-type impurity diffusion layer 15, thereby suppressing an increase of the channel resistance and avoiding a reduction of on-current. The channel is formed in a portion of the active region 1a, which is in contact with the gate electrode 31 while the first gate insulating film 25 is interposed between the portion and the gate electrode 31. When the negative bias is applied to the dummy gate electrode 32 in order to isolate the adjacent transistors 2, an increase of the electric field intensity between the dummy gate electrode 32 and the n-type impurity diffusion layer 15 can be suppressed. Therefore, an increase of the junction leak current can be prevented.

Cap insulating films 43 are formed on the top surface 31c of the gate electrode 31 buried in the first groove 13a and on the top surface 32c of the dummy gate electrode 32 buried in the second groove 13b. The cap insulating films 43 protrude from the top surface 1b of the semiconductor substrate 1.

The bit line 51 also functions as a contact plug coupled to the source region (the first n-type impurity diffusion layer 15a) of the transistor 2. The bit line 51 is provided on the n-type impurity diffusion layer 15 (the first n-type impurity diffusion layer 15a) between the adjacent gate electrodes 31.

The bit line 51 may include, but is not limited to, a first bit line material 47 and a second bit line material 49. The first bit line material 47 may be, for example, a polysilicon film with a thickness of approximately 80 nm, into which phosphorus is introduced at a concentration of approximately $1 \times 10^{20}$ atoms/cm$^3$. Phosphorus is the n-type impurity element. The second bit line may be, for example, a lamination of a tungsten nitride film with a thickness of approximately 5 nm and a tungsten film with a thickness of approximately 70 nm.

A silicon nitride ($Si_3N_4$) film 53 with a thickness of, for example, approximately 10 nm covers the bit line 51 and a top surface of the cap insulating film 43.

A first interlayer insulating film 55 with a thickness of for example, approximately 400 nm covers the silicon nitride film 53. A contact hole 57A penetrates the first interlayer insulating film 55 and the silicon nitride film 53.

One of contact plugs 58 formed in the contact hole 57A is coupled to the second n-type impurity diffusion layer 15b which is the drain region of the transistor 2 (the first transistor Tr1). The drain region is the n-type impurity diffusion layer 15 between the gate electrode 31 and the dummy gate electrode 32. The other of contact plugs 58 is coupled to the third n-type impurity diffusion layer 15c which is the drain region of the transistor 2 (second transistor Tr2).

According to the present embodiment, the contact plug 58 may be polysilicon including phosphorus, but is not limited thereto. A metal material such as tungsten may be used. If the contact plug 58 is formed of the metal material, the resistivity of the contact plug 58 is lower than in the case where the contact plug is formed of polysilicon. Therefore, the operation speed of the DRAM is improved. When the metal material is used for the contact plug 58, a barrier layer formed by laminating a silicide layer and a metal nitride layer should be formed on the second n-type impurity diffusion layer 15b or the third n-type impurity diffusion layer 15c which is connected to the contact plug 58.

A capacitor contact pad 82 may be, for example, a lamination of a tungsten nitride film and a tungsten film. The capacitor contact pad 82 is disposed on the contact plug 58.

A second interlayer insulating film 83 formed of, for example, a silicon nitride film covers the capacitor contact pad 82 and a top surface of the first interlayer insulating film 55. A third interlayer insulating film 84 formed of, for example, a silicon oxide film covers a top surface of the second interlayer insulating film 83.

The capacitor 8 may include, but is not limited to, a first electrode 86, a capacitive insulating film 87, and a second electrode 88. The first electrode 86 may be formed of, for example, titanium nitride. The capacitive insulating film 87 may be, for example, a zirconium oxide ($ZrO_2$) film. The second electrode 88 may be formed of, for example, titanium nitride. The capacitor 8 penetrates the third interlayer insulating film 84 and the second interlayer insulating film 83 and coupled to the capacitor contact pad 82. The capacitor 8 is coupled to the second n-type impurity diffusion layer 15b or the third n-type impurity diffusion layer 15c through the capacitor contact pad 82 and the contact plug 58.

The capacitor 8 according to the present embodiment is described as a cylinder capacitor, in which only the inner wall of the first electrode 86 is used as the electrode, as an example, but is not limited thereto. The capacitor 8 may have a different structure. For example, the capacitor 8 may be a crown capacitor in which an inner wall and an outer wall of the first electrode 86 are used as the electrode.

The wiring layer 90 is disposed over the capacitor 8 while the third interlayer insulating film 84 is interposed between the wiring layer 90 and the capacitor 8. The wiring layer 90 may include an aluminum (Al) film or a copper (Cu) film. The wiring layer 90 may be the aluminum (Al) film or the copper (Cu) film. According to the present embodiment, the wiring layer 90 is described as a single layer as an example, but is not limited thereto. The wiring layer 90 may have, for example, a multi-layer structure including a plurality of wiring layers and interlayer insulating films. A protective film 91 covers the wiring layer 90 and the third interlayer insulating film 89.

According to the semiconductor device 10 of the present embodiment, the channel is formed in the vicinity of the surface of the semiconductor substrate 1 in the first groove 13a by applying an electric voltage that is greater than the threshold voltage. While the channel is formed in the vicinity of the surface of the semiconductor substrate 1 in the first groove 13a, charges flow from the source region (first n-type impurity diffusion layer 15a) to the drain region (second n-type impurity diffusion layer 15b) by applying an electric voltage to the source region of the transistor 2 (the first n-type impurity diffusion layer 15a) through the bit line 51. Thereby, transistor 2 is turned on. The charges which has flowed to the second n-type impurity diffusion layer 15b are stored in the capacitor 8 through the contact plug 58, thereby storing information to the memory cell. The dummy gate electrode 32 electrically separates the adjacent transistors 2 interposing the dummy gate electrode 32.

According to the semiconductor device 10 of the present embodiment, the top surface 32c of the dummy gate electrode 32 is positioned at a lower level than the junction position 15d of the n-type impurity diffusion layer 15. A side surface of the n-type impurity diffusion layer 15 and a side surface of the dummy gate electrode 32 are not adjacently positioned to overlap each other. Therefore, an increase of an electric field intensity between the dummy gate electrode 32 and the n-type impurity diffusion layer 15 can be suppressed, thereby suppressing an increase of a junction leak current. A leakage of the electric charge information stored in the capacitor 8 is suppressed, thereby improving an information storing property of the DRAM.

It is preferable that the top surface 32c of the dummy gate electrode 32 is at level that is at least 20 nm lower than the junction position 15d of the n-type impurity diffusion layer 15. Since the top surface 32c is formed at level that is at least 20 nm lower than the junction position 15d, sufficient margin can be maintained in order not to cause an increase of the junction leak current even when a position of the top surface 32c is changed because of a process deviation of the dummy gate electrode 32 and an unevenness of a processed surface of the dummy gate electrode 32.

A position of the top surface 32c of the dummy gate electrode 32 should be at a higher level than the depth subtracted from the thickness of the second gate insulating film 25b from the second groove 13b to be buried by the dummy gate electrode 32. When the position of the top surface 32c of the dummy gate electrode 32 is at a higher level than the depth of the second groove 13b minus the thickness of the second gate insulating film 25b, a space for forming the dummy gate electrode 32 does not exist. Therefore, element isolation cannot be performed.

The top surface 31c of the gate electrode 31 is at a higher level than the junction position 15d of the n-type impurity diffusion layer 15. Due to this structure, when an electric voltage more than the threshold voltage is applied to the gate electrode 31, the channel which is a part of the active region 1a is reliably connected to the n-type impurity diffusion layer 15, thereby suppressing an increase in the channel resistance and avoiding a reduction of on-current. The part of the active region 1a is in contact with the gate electrode 31 while the first gate insulating film 25a is interposed between the active region 1a and the gate electrode 31.

As described above, the semiconductor device 10 including the dummy gate electrode 32 which isolates the elements (transistors 2) is provided. Also, the semiconductor device 10 in which an increase of the junction leak current can be prevented and a deterioration of an information storing property of the DRAM can be prevented is provided.

Method for Forming the Semiconductor Device

The method for forming the DRAM (semiconductor device) 10 will be described with reference to FIGS. 1 and 3 through 26. FIGS. 3 through 26 are fragmentary cross sectional elevation views, taken along the A-A' line of FIG. 1, illustrating the semiconductor device in a step involved in the method of forming the semiconductor device in accordance with one embodiment of the present invention.

The method for forming the semiconductor device 10 according to the present embodiment may include, but is not limited to, a process for forming the transistor 2, a process for forming the bit line 51, a process for forming the capacitor 8, and a process for forming the wiring layer 90.

As shown in FIG. 1, the isolation region 4 is formed to define the active region 1a. Although the detailed illustration in the drawings is omitted, a pad silicon oxide ($SiO_2$) film with a thickness of, for example, 5 nm is formed on the semiconductor substrate 1 including p-type single crystalline silicon by a thermal oxidation. A silicon nitride film ($Si_3N_4$) with a thickness of, for example, 50 nm is formed on the pad silicon oxide film by CVD (Chemical Vapor Deposition). The silicon nitride film is used as a mask.

The silicon nitride film, the pad silicon oxide film, and the semiconductor substrate 1 are sequentially anisotropically dry etched by using a photolithography and a dry etching process. By this etching process, an isolation groove (trench) defining the active region 1a is formed on the semiconductor substrate 1. The etching process may be performed so that the depth of the isolation groove is approximately 200 nm. At this time, a surface of the active region 1a of the semiconductor substrate 1 is covered by the silicon nitride film and the pad silicon oxide film, which are used as the mask.

A silicon oxide film is deposited to fill the isolation groove by CVD, for example. The silicon oxide film is polished by CMP (Chemical Mechanical Polishing) until a surface of the silicon nitride film used as the mask is exposed. Then, the silicon nitride film and the pad silicon oxide film used as the mask are removed. Thereby, the isolation region 4 extending in the X-direction is formed. Also, the active region 1a defined by the isolation region 4 is formed.

Figure 3:
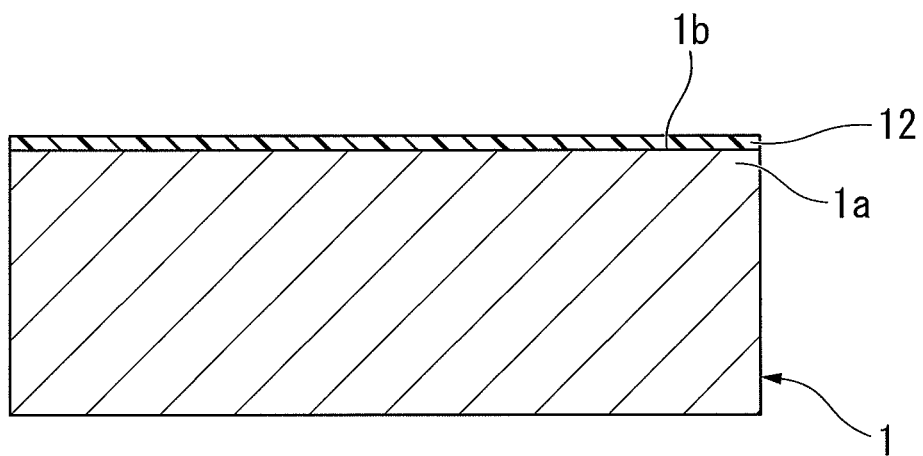
FIG. 3 is a fragmentary cross sectional elevation view, taken along a A-A' line of FIG. 1, illustrating the semiconductor device in a step involved in a method of forming the semiconductor device in accordance with one embodiment of the present invention.

As shown in FIG. 3, a pad silicon oxide film 12 with a thickness of, for example, approximately 10 nm is formed by thermal oxidation so as to cover a top surface 1b of the active region 1a.

Figure 4:
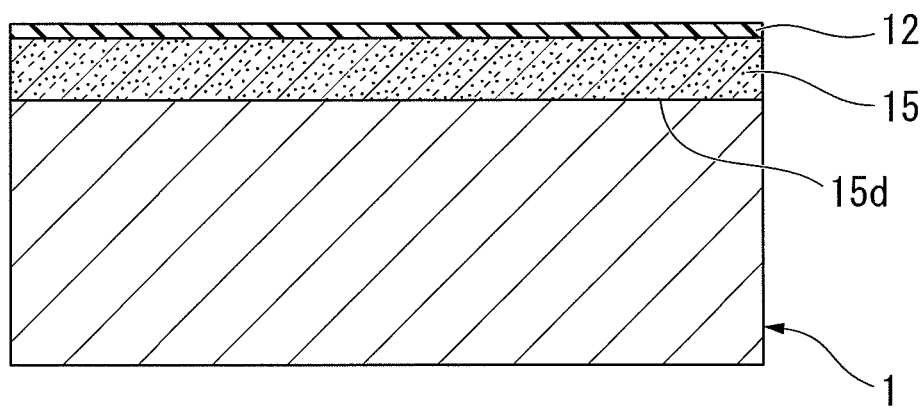
FIG. 4 is a fragmentary cross sectional elevation view, taken along the A-A' line of FIG. 1, illustrating the semiconductor device in a step, subsequent to the step of FIG. 3, involved in the method of forming the semiconductor device in accordance with one embodiment of the present invention.

As shown in FIG. 4, the n-type impurity diffusion layer 15 is formed in the surface layer of the active region 1a. In some cases, n-type impurity elements such as phosphorus are ion-implanted to the active region 1a in the condition where the dosage is approximately $1.0 \times 10^{13}$ atoms/cm$^2$, and the acceleration voltage is 20 keV. Then, the n-type impurity elements are diffused by heating, thereby forming the n-type impurity diffusion layer 15 in the active region 1a. The n-type impurity diffusion layer 15 functions as one of the source region and the drain region of the transistor 2. The bottom of the n-type impurity diffusion layer 15 forms the p-n junction. The position of the p-n junction refers to as the junction position 15d. According to the present embodiment, the depth of the junction position 15d is 50 nm from the top surface 1b of the active region 1a.

Figure 5:
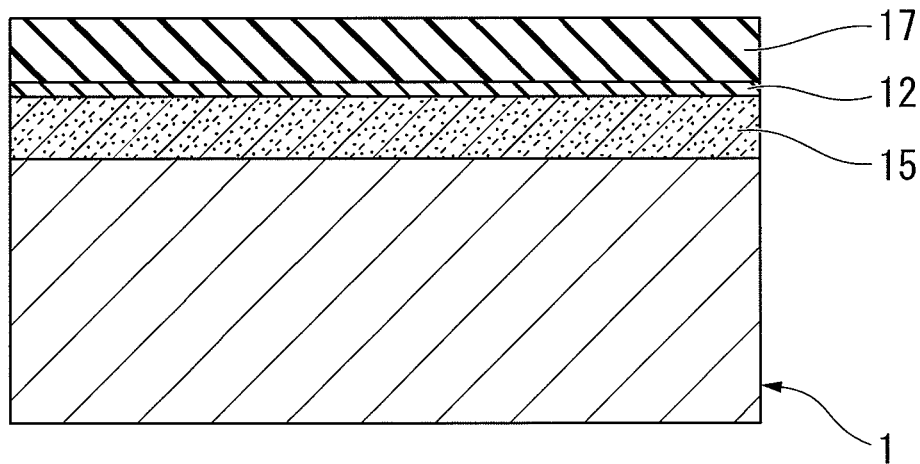
FIG. 5 is a fragmentary cross sectional elevation view, taken along the A-A' line of FIG. 1, illustrating the semiconductor device in a step, subsequent to the step of FIG. 4, involved in the method of forming the semiconductor device in accordance with one embodiment of the present invention.

As shown in FIG. 5, a silicon nitride film 17 with a thickness of approximately 70 nm is formed by CVD to cover the pad silicon oxide film 12. A carbon film (amorphous carbon film) 21, for example, is formed by CVD to cover the silicon nitride film 17.

Figure 6:
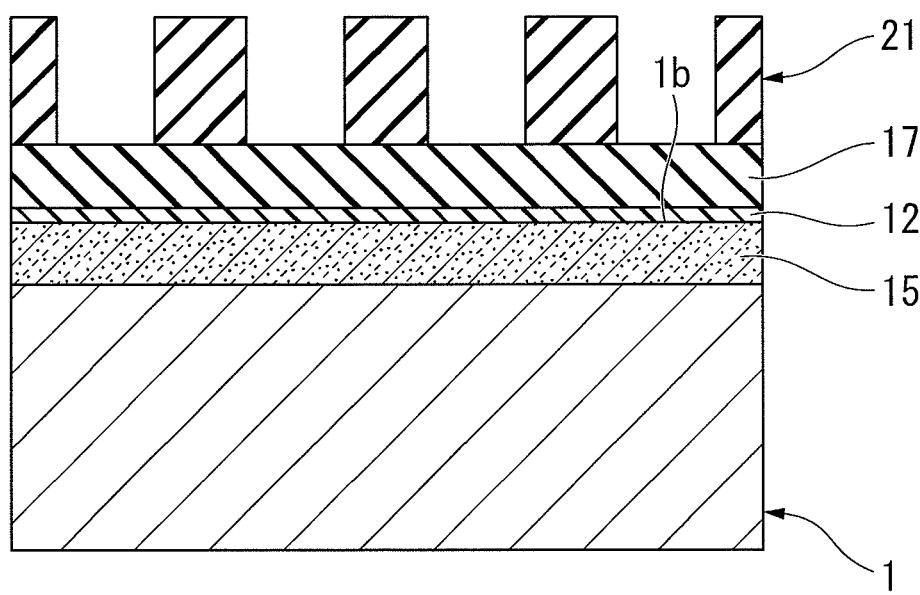
FIG. 6 is a fragmentary cross sectional elevation view, taken along the A-A' line of FIG. 1, illustrating the semiconductor device in a step, subsequent to the step of FIG. 5, involved in the method of forming the semiconductor device in accordance with one embodiment of the present invention.

As shown in FIG. 6, a resist pattern is transferred to the carbon film 21 by lithography and a dry etching process.

As shown in FIG. 6, the silicon nitride film 17 and the pad silicon oxide film 12 are sequentially anisotropically dry etched using the patterned carbon film 21 as a mask. Then, a top surface of the active region 1a of the semiconductor substrate 1 is shown. A top surface of the silicon nitride film 17 is shown by removing the carbon film 21 used as the mask.

Figure 7:
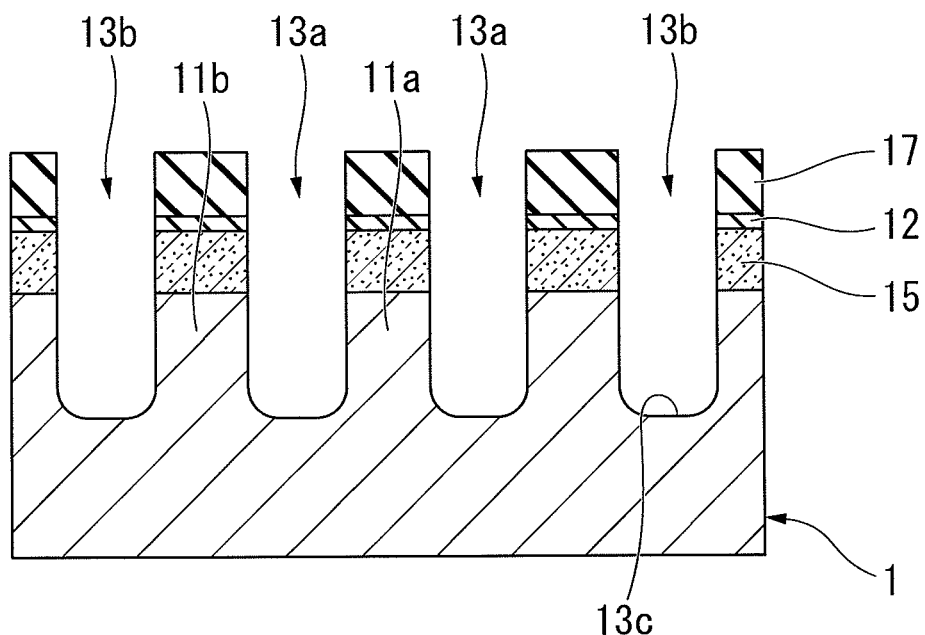
FIG. 7 is a fragmentary cross sectional elevation view, taken along the A-A' line of FIG. 1, illustrating the semiconductor device in a step, subsequent to the step of FIG. 6, involved in the method of forming the semiconductor device in accordance with one embodiment of the present invention.

As shown in FIG. 7, an upper surface of the semiconductor substrate 1 is anisotropically dry etched using the silicon nitride film 17 as a mask. Due to the etching process, first grooves 13a and second grooves 13b are formed. The first grooves 13a and second grooves 13b are formed in line-and-space pattern extending in a predetermined direction (Y-direction in FIG. 1) crossing the active region 1a. The depth of bottom surfaces 13c of the first grooves 13a and second grooves 13b is shallower than a bottom surface of the isolation region 4. For example, an etching condition is set so that the depth of the bottom surface 13c of the first and second grooves 13a and 13b is 150 nm from the top surface of the semiconductor substrate 1.

By forming the first grooves 13a and second grooves 13b, the first region 11a between the adjacent first grooves 13a and the second region 11b between the first groove 13a and the second groove 13b adjacent to the first groove 13a are formed.

Figure 8:
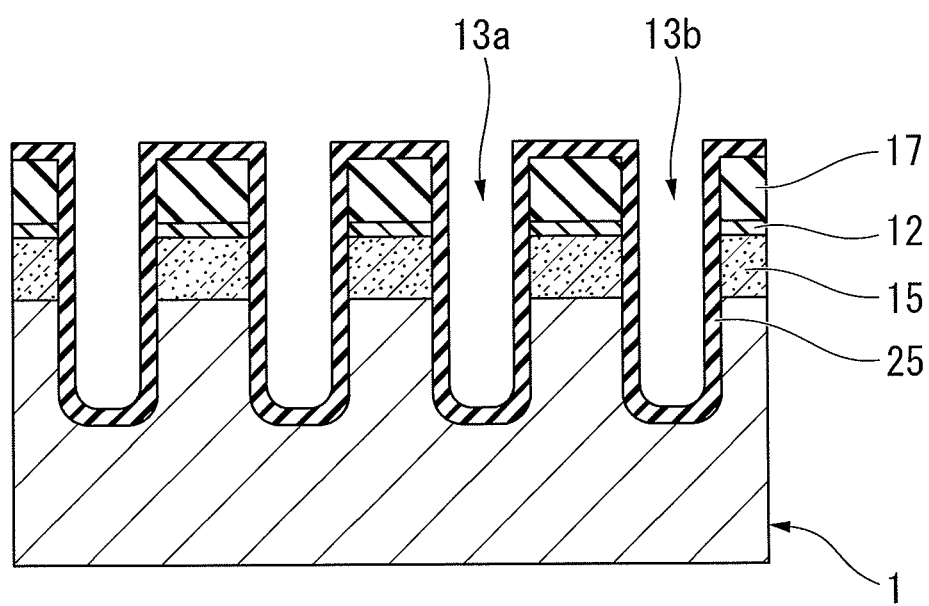
FIG. 8 is a fragmentary cross sectional elevation view, taken along the A-A' line of FIG. 1, illustrating the semiconductor device in a step, subsequent to the step of FIG. 7, involved in the method of forming the semiconductor device in accordance with one embodiment of the present invention.

As shown in FIG. 8, a silicon oxide film with a thickness of 4 nm is formed, by ISSG (In Situ Steam Generation) thermal oxidation, on the surface (silicon surface) of the semiconductor substrate in the first and second grooves 13a and 13b and on a surface of the silicon nitride film 17. The gate insulating film 25 formed of the silicon oxide film is formed on the silicon surface in the first and second grooves 13a and 13b.

Figure 9:
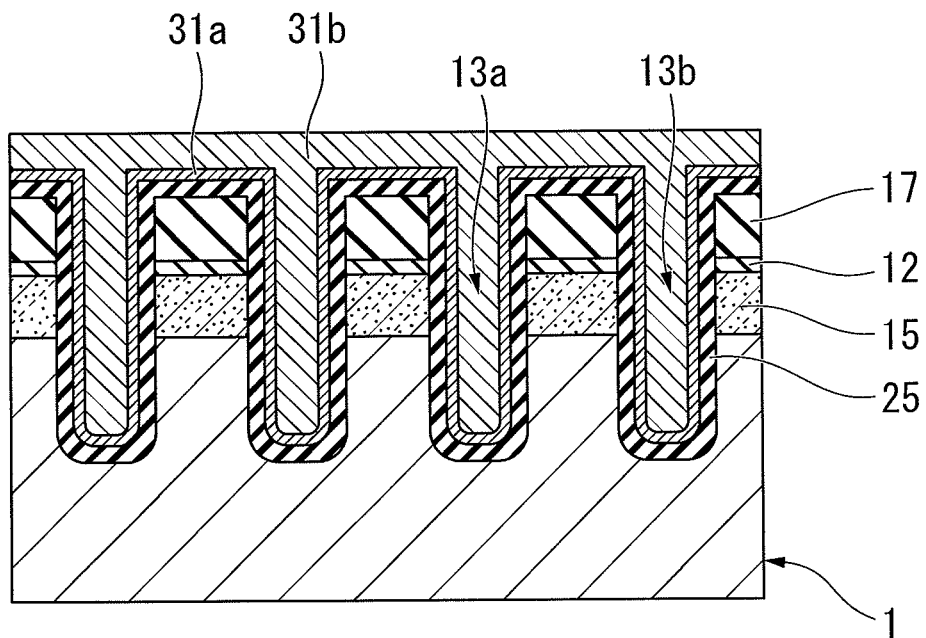
FIG. 9 is a fragmentary cross sectional elevation view, taken along the A-A' line of FIG. 1, illustrating the semiconductor device in a step, subsequent to the step of FIG. 8, involved in the method of forming the semiconductor device in accordance with one embodiment of the present invention.

As shown in FIG. 9, a first conductive material 31a formed of a titanium nitride film with a thickness of 10 nm is deposited by CVD so as to cover the entire surface including inner surfaces of the first and second grooves 13a and 13b. A second conductive material 31b formed of a tungsten film with a thickness of 50 nm is entirely deposited by CVD so as to fill the first and second grooves 13a and 13b.

Figure 10:
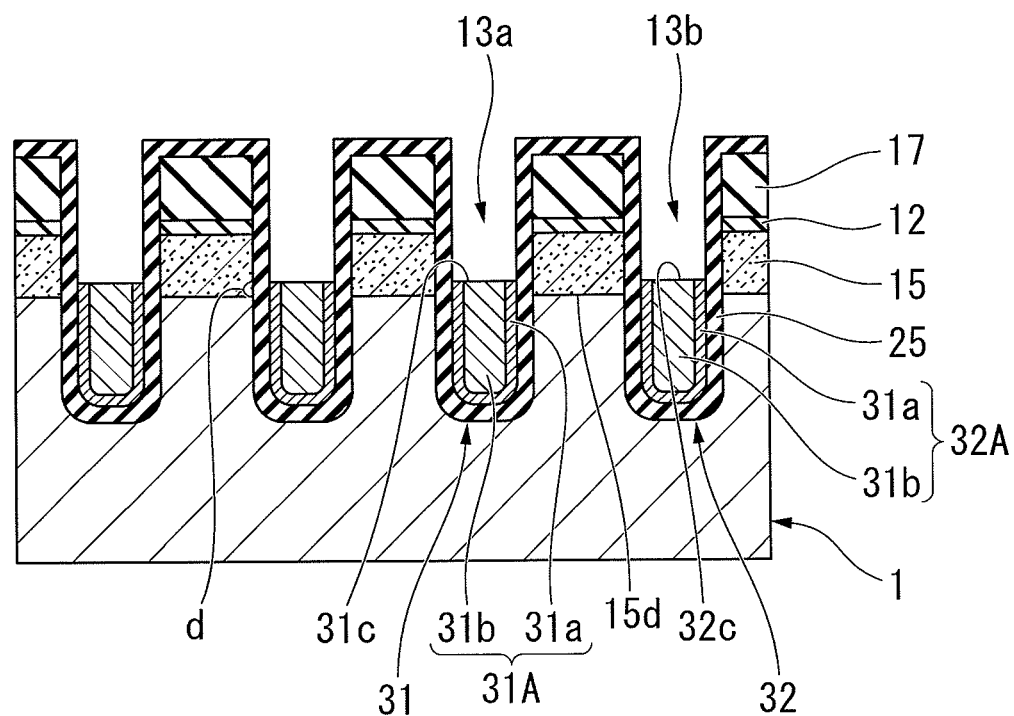
FIG. 10 is a fragmentary cross sectional elevation view, taken along the A-A' line of FIG. 1, illustrating the semiconductor device in a step, subsequent to the step of FIG. 9, involved in the method of forming the semiconductor device in accordance with one embodiment of the present invention.

As shown in FIG. 10, the second conductive material 31b and the first conductive material 31a are etched-back by a dry etching process using plasma of chlorine gases. Thereby, top surfaces of the second conductive material 31b and the first conductive material 31a are positioned in the first and second grooves 13a and 13b. Since the second conductive material 31b and the first conductive material 31a are metal materials, a condition of the dry etching process can be set so that etching rates of the second conductive material 31b and the first conductive material 31a are the same.

By the etching process, the etched-back top surface of the second conductive material 31b is aligned with the etched-back top surface of the first conductive material 31a. Also, the etching-back process can be performed in the two steps. For example, the second conductive material 31b is etched-back to a predetermined depth. Then, the first conductive material 31a in the first groove 13a and second groove 13b, which is exposed by the etching-back process is isotropically etched and removed.

In the etching-back process, an etching condition is set so that the top surfaces 31c and 32c which are formed by the first conductive material 31a and the second conductive material 31b are at a lower level than the top surface 1b of the semiconductor substrate 1 and is at a higher level than the junction position 15d of the n-type impurity diffusion layer 15.

By the etching-back process, the gate electrode 31 and the dummy gate electrode 32 for the element isolation are formed. The gate electrode 31 is formed of the first conductive layer 31A which is buried in the first groove 13a while the gate insulating film 25 is interposed between the first conductive layer 31A and the surface of the first groove 13a. The first conductive layer 31A includes the first conductive material 31a and the second conductive material 31b. The dummy gate electrode 32 is formed of the second conductive layer 32A which is buried in the second groove 13b while the second insulating film 25 is interposed between the second conductive layer 32A and the surface of the second groove 13b. The second conductive layer 32A includes the first conductive material 31a and the second conductive material 31b.

Since the first conductive layer 31A and the second conductive layer 32A are formed in the same steps, the top surface 31c of the first conductive layer 31A and the top surface 32c of the second conductive layer 32A are leveled. Since the top surface 31c and the top surface 32c is higher in level than the junction position 15d, side surfaces of the first and second conductive layers 32A and 32B face a side surface of the n-type impurity diffusion layer 15 in a region d while the first gate insulating film 25a is interposed between the gate electrode 31 and the n-type impurity diffusion layer 15.

Figure 11:
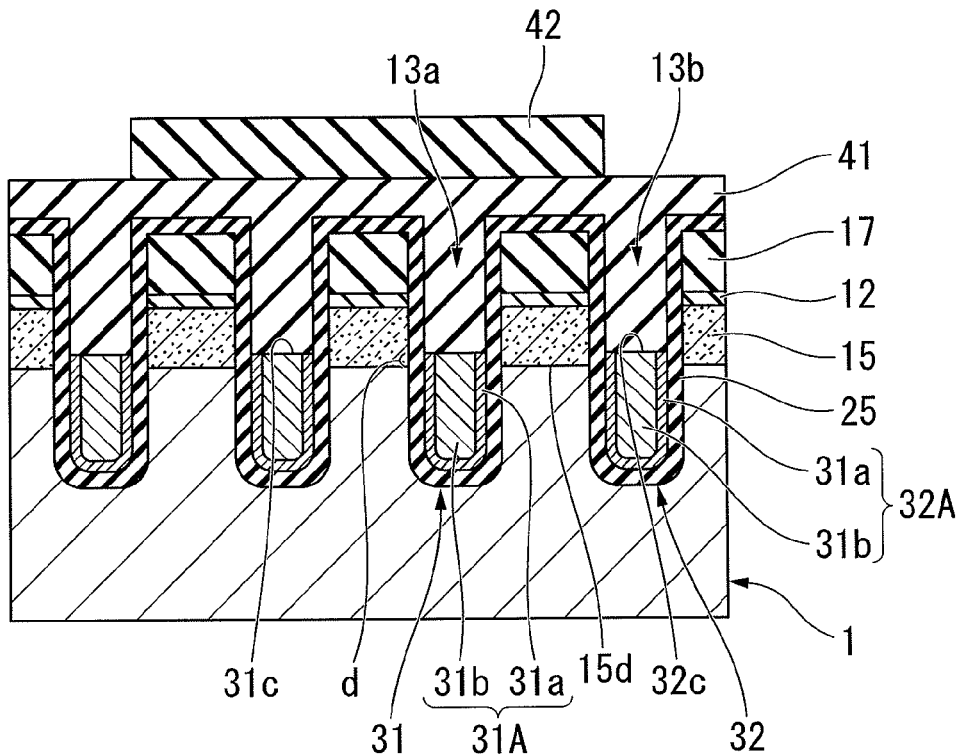
FIG. 11 is a fragmentary cross sectional elevation view, taken along the A-A' line of FIG. 1, illustrating the semiconductor device in a step, subsequent to the step of FIG. 10, involved in the method of forming the semiconductor device in accordance with one embodiment of the present invention.

As shown in FIG. 11, a first sacrificial mask 41 and a second sacrificial mask 42 are formed.

The first sacrificial mask 41 formed of an amorphous carbon film is formed on the entire surface to fill the first groove 13a and the second groove 13b by CVD. Then, the second sacrificial mask 42 formed of a silicon nitride film with a thickness of 5 nm is formed to cover the first sacrificial mask 41.

A part of the second sacrificial mask 42, which is positioned over the second groove 13b is removed by a lithography and a dry etching process, thereby showing a top surface of the first sacrificial mask 41.

Figure 12:
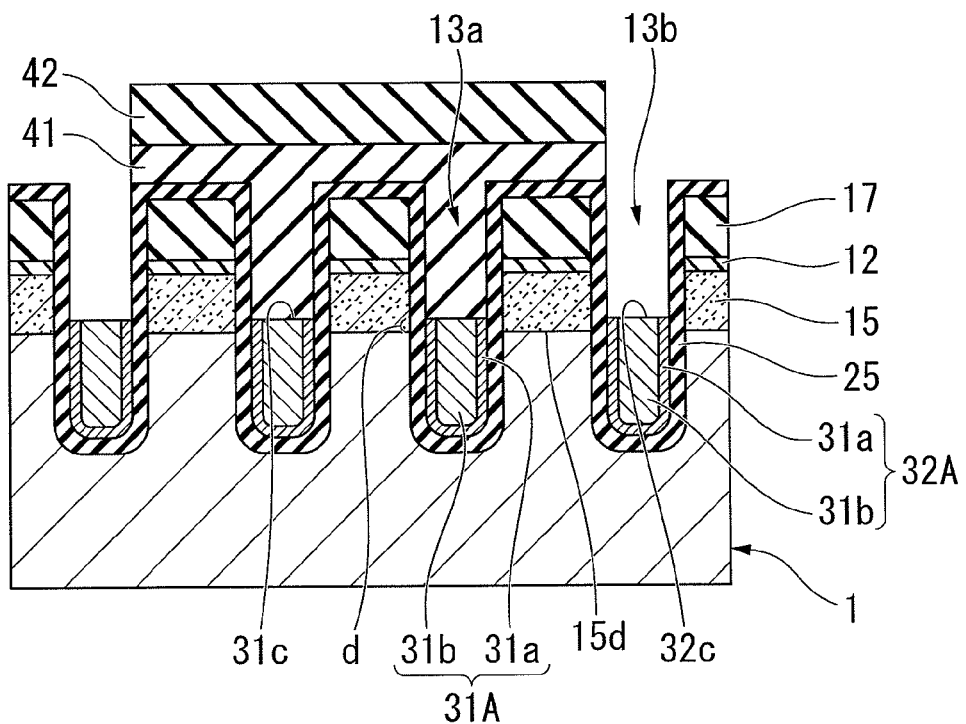
FIG. 12 is a fragmentary cross sectional elevation view, taken along the A-A' line of FIG. 1, illustrating the semiconductor device in a step, subsequent to the step of FIG. 11, involved in the method of forming the semiconductor device in accordance with one embodiment of the present invention.

As shown in FIG. 12, the first sacrificial mask 41 formed of the amorphous carbon film is etched using the second sacrificial mask 42 as a mask. Thereby, the top surface 32c of the second conductive layer 32A is shown. Since the amorphous carbon film essentially includes only carbon, the amorphous carbon film can be etched by only oxygen without using etching gases such as fluorine gas or chlorine gas which is generally used in the dry etching process. Therefore, in the etching process, the amorphous carbon film can be etched using oxygen gas plasma without etching the second sacrificial mask 42 and the gate insulating film 25 which are formed of the silicon nitride film. The top surface of 32c of the second conductive layer 32A can be exposed without changing the forms of the other structures.

Figure 13:
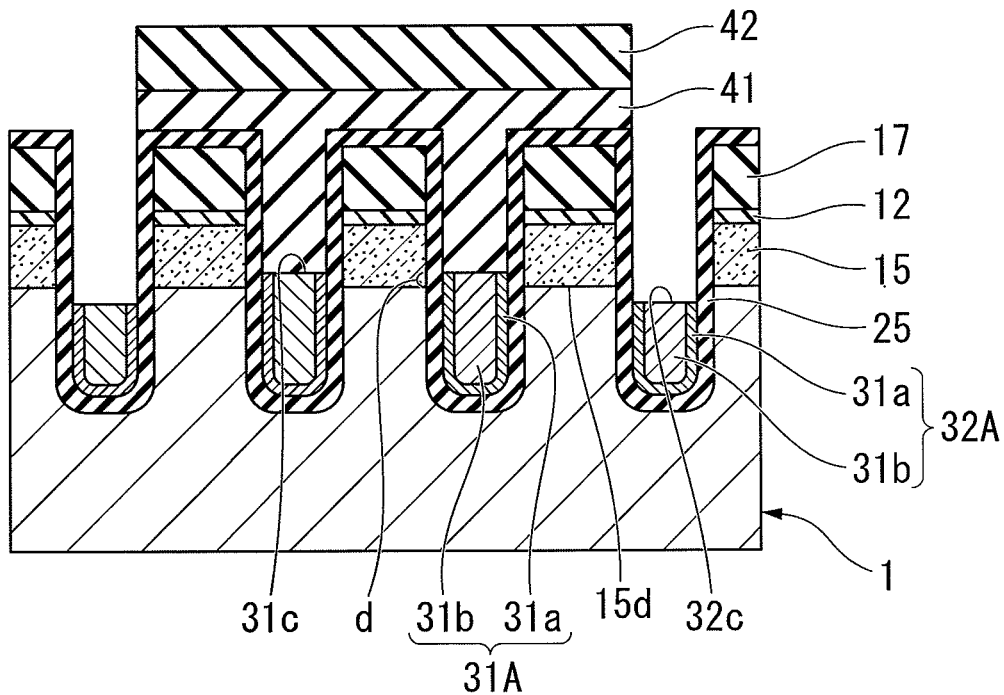
FIG. 13 is a fragmentary cross sectional elevation view, taken along the A-A' line of FIG. 1, illustrating the semiconductor device in a step, subsequent to the step of FIG. 12, involved in the method of forming the semiconductor device in accordance with one embodiment of the present invention.

As shown in FIG. 13, the top surface 32c of the second conductive layer 32A which functions as the dummy gate electrode 32 is etched-back so as to be lower in level than the junction position 15d of the n-type impurity diffusion layer 15.

The etching-back process is performed so that the top surface 32c is positioned at level that is at least 20 nm lower than the junction position 15d.

The second sacrificial mask 42 formed of the silicon nitride film is removed by a wet etching process using phosphorus acid. Then, the remaining first sacrificial mask 41 is removed by a dry etching process using oxygen gas plasma. The top surface 31c of the gate electrode 31 and the top surface 32c of the dummy gate electrode 32 are shown. The top surface 31c is at a higher level than the junction position 15d. The top surface 32c is at a lower level than the junction position 15d.

Figure 14:
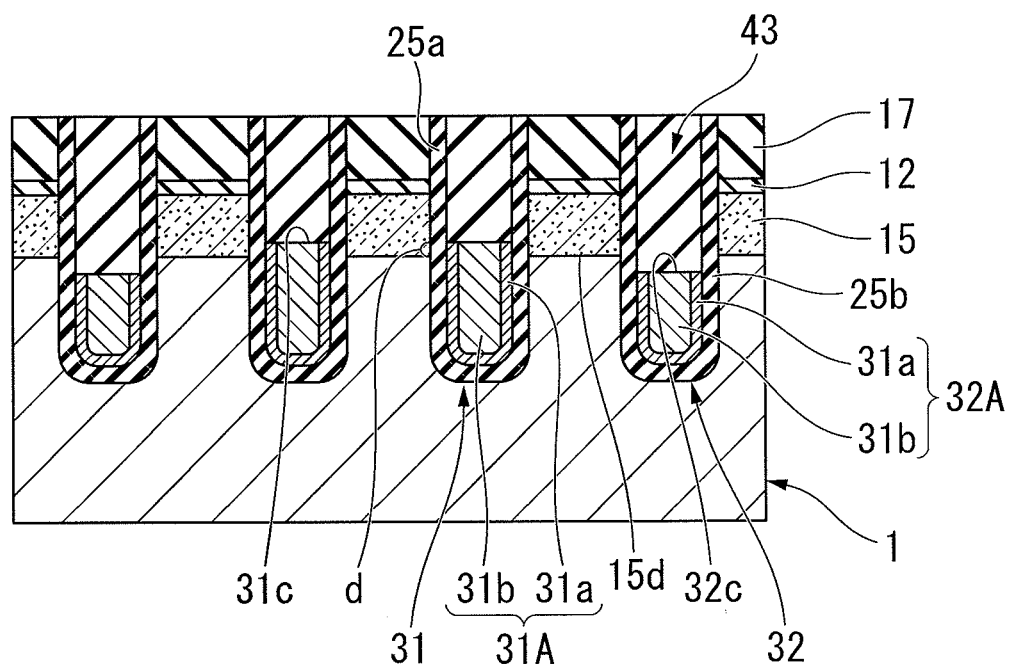
FIG. 14 is a fragmentary cross sectional elevation view, taken along the A-A' line of FIG. 1, illustrating the semiconductor device in a step, subsequent to the step of FIG. 13, involved in the method of forming the semiconductor device in accordance with one embodiment of the present invention.

As shown in FIG. 14, the cap insulating film 43 is formed. A plasma oxidation film with a thickness of, for example, approximately 140 nm is formed to fill the first groove 13a and the second groove 13b. Then, a surface of the plasma oxidation film is polished by CMP until the silicon nitride film 17 is shown. By the polishing process, cap insulating films 43 which fill the first groove 13a and the second groove 13b. A part of the gate insulating film 25, which is formed on the silicon nitride film 17, is removed. Thereby, the gate insulating film 25a remains in the first groove 13a and the second gate insulating film 25b remains in the second groove 13b.

Figure 15:
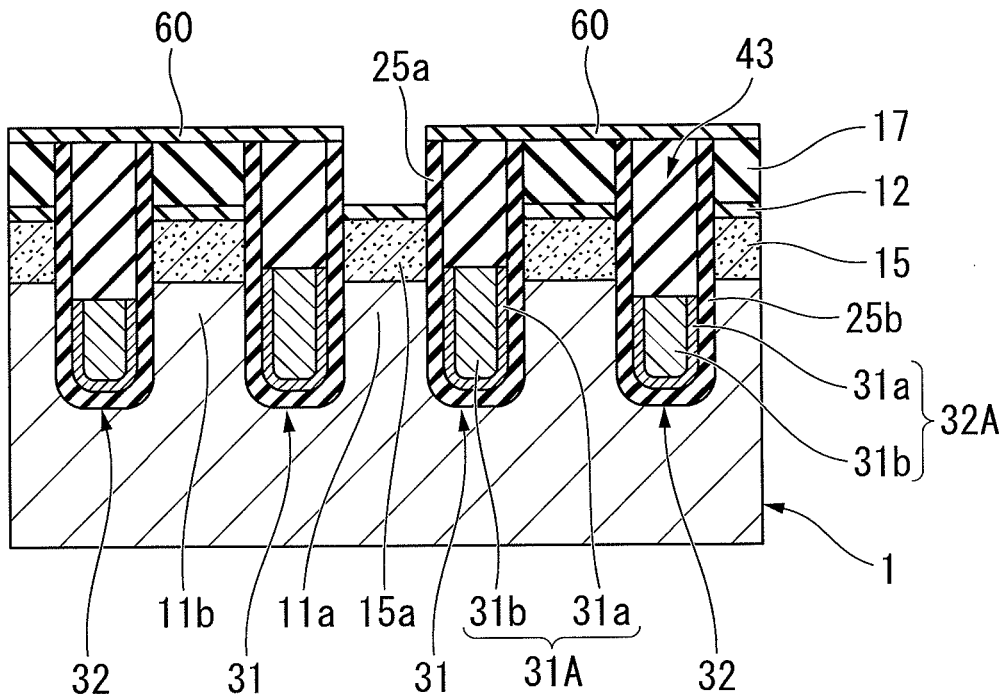
FIG. 15 is a fragmentary cross sectional elevation view, taken along the A-A' line of FIG. 1, illustrating the semiconductor device in a step, subsequent to the step of FIG. 14, involved in the method of forming the semiconductor device in accordance with one embodiment of the present invention.

As shown in FIG. 15, a silicon oxide film 60 with a thickness of 10 nm is deposited on the entire surface. Then, an opening is formed in the silicon oxide film 60 so that part of the surface of the silicon nitride film 17, which is positioned over the first n-type impurity diffusion layer 15a, is shown. The first n-type impurity diffusion layer 15a functions as the source region. After removing a resist pattern (not shown) used in the lithography, the exposed part of the silicon nitride film 17 is removed by a wet etching process using phosphorus acid using the silicon oxide film 60 as a mask. Thereby, a surface of the pad silicon oxide film 12 is exposed.

Figure 16:
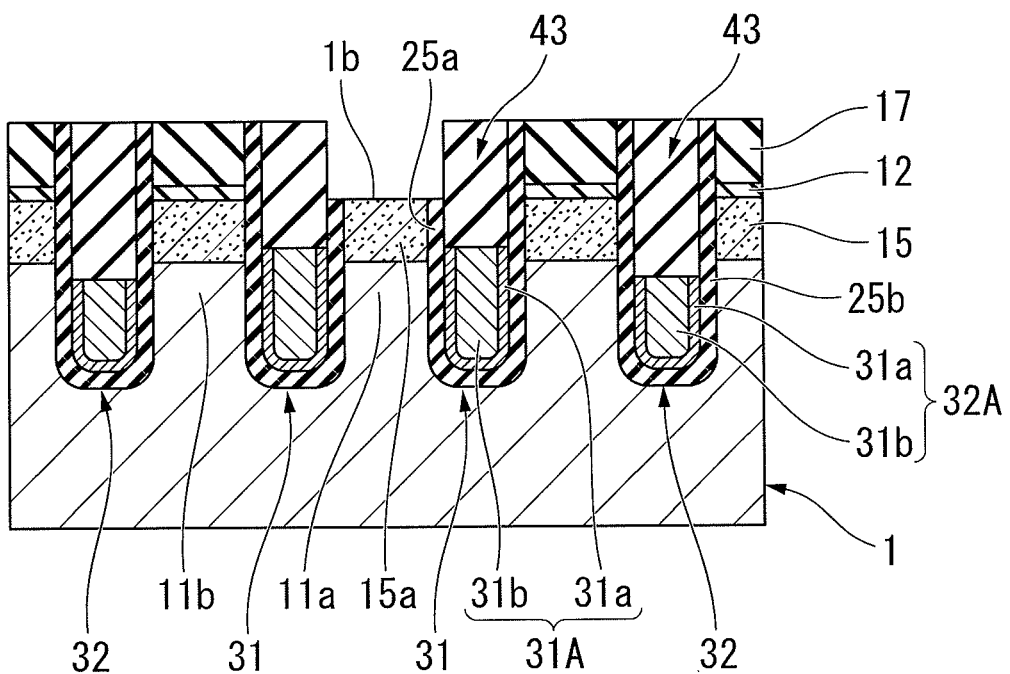
FIG. 16 is a fragmentary cross sectional elevation view, taken along the A-A' line of FIG. 1, illustrating the semiconductor device in a step, subsequent to the step of FIG. 15, involved in the method of forming the semiconductor device in accordance with one embodiment of the present invention.

As shown in FIG. 16, the pad silicon oxide film 12 whose surface is exposed is wet etched, thereby showing the top surface of the first n-type impurity diffusion layer 15a. The first n-type impurity diffusion layer 15a functions as the source region. During this process, the silicon oxide film 60 used as the mask and part of the gate insulating film 25a on a side wall of the cap insulating film 43 are also removed.

Figure 17:
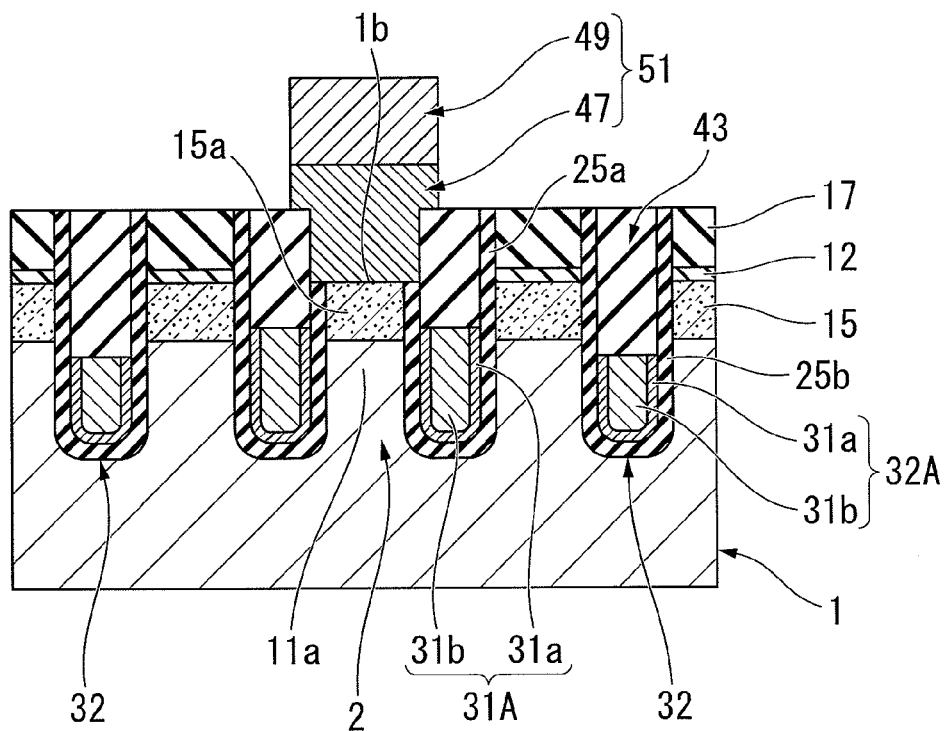
FIG. 17 is a fragmentary cross sectional elevation view, taken along the A-A' line of FIG. 1, illustrating the semiconductor device in a step, subsequent to the step of FIG. 16, involved in the method of forming the semiconductor device in accordance with one embodiment of the present invention.

As shown in FIG. 17, the bit line 51 is formed. The first bit line material 47 is filled in the opening to cover the first region 11a and the cap insulating film 43. The first bit line material 47 may be, for example a polysilicon film doped with phosphorus, which is an n-type impurity, at a concentration of $1\times10^{20}$ atoms/cm$^3$. The thickness of the polysilicon film is approximately 80 nm.

The second bit line material 49 formed of, for example, a tungsten nitride film and a tungsten film is fog med. The tungsten nitride film with a thickness of approximately 5 nm and the tungsten film with a thickness of 70 nm are sequentially deposited to cover the first bit line material 47.

A lamination of the first bit line material 47 and the second bit line material 49 is patterned in a line shape. By the patterning process, the bit line 51 connected to the first n-type impurity diffusion layer 15a is formed. Also, the transistor 2 is formed when the bit line 51 is formed.

The bit line 51 according to the present embodiment extends in a direction (the X-direction in FIG. 1) crossing the gate electrode 31 and the dummy gate electrode 32. The bit line 51 may be straight, but is not limited thereto. For example, the bit line 51 may be partly curved.

Figure 18:
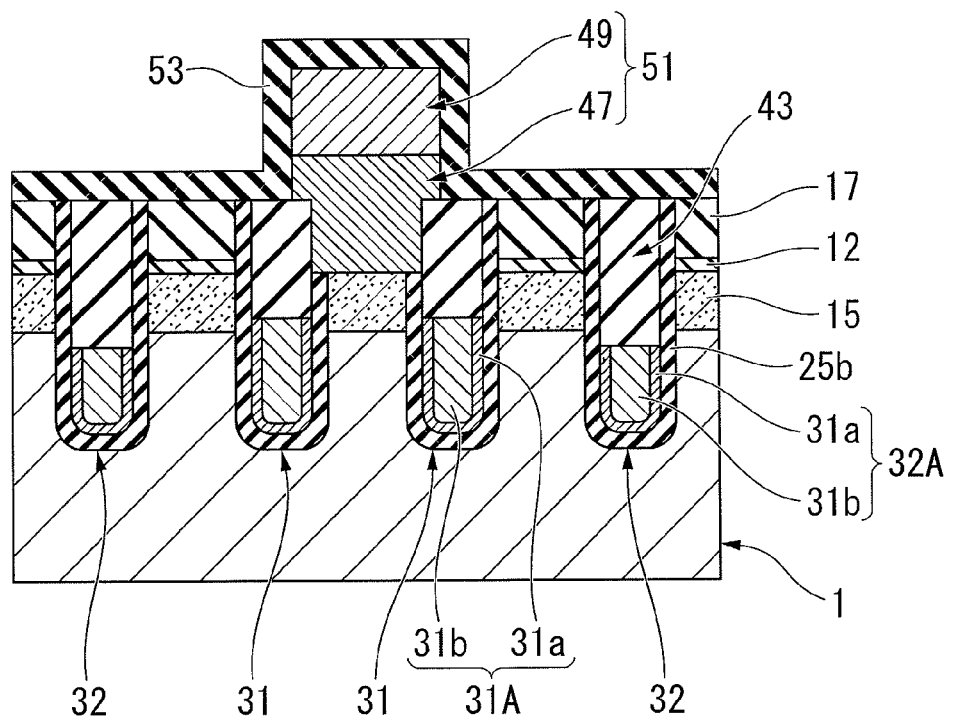
FIG. 18 is a fragmentary cross sectional elevation view, taken along the A-A' line of FIG. 1, illustrating the semiconductor device in a step, subsequent to the step of FIG. 17, involved in the method of forming the semiconductor device in accordance with one embodiment of the present invention.

As shown in FIG. 18, a silicon nitride ($Si_3N_4$) film 53 with a thickness of, for example, 10 nm is formed by, for example, LP-CVD (Low Pressure Chemical Vapor Deposition) to cover the cap insulating film 43 and the bit line 51.

Figure 19:
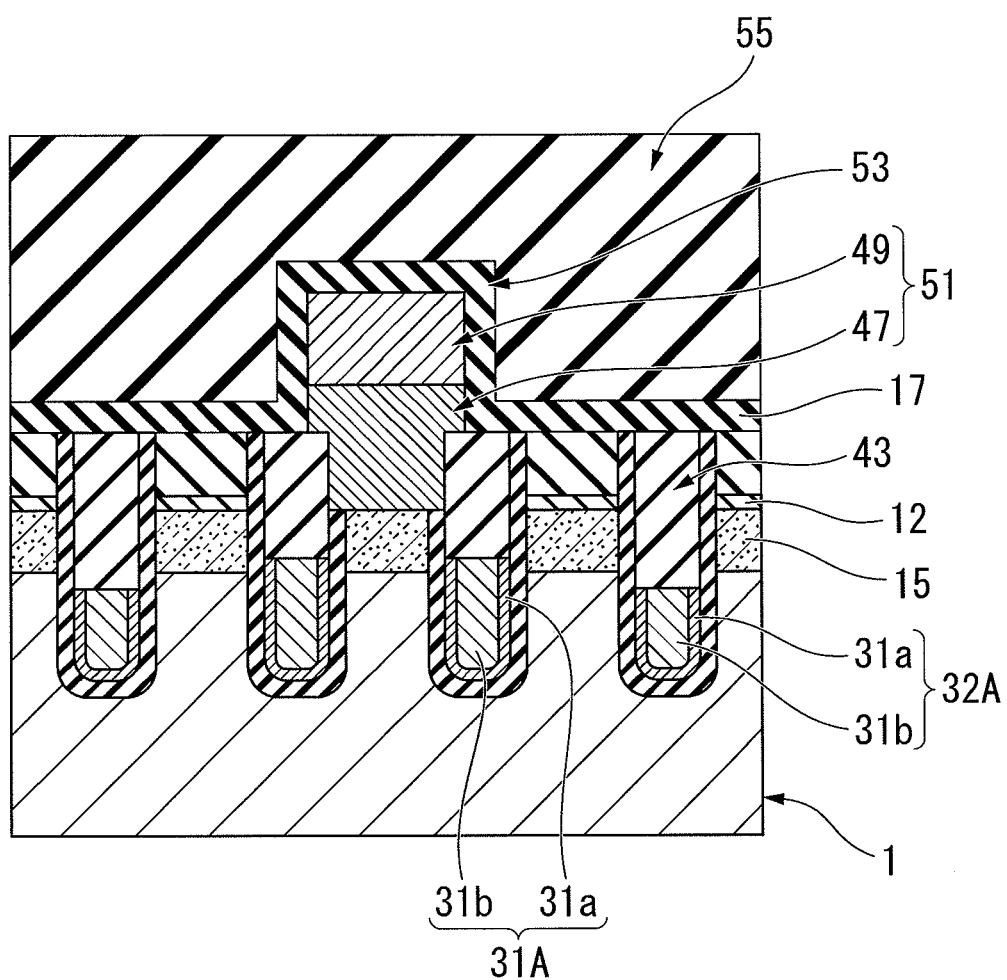
FIG. 19 is a fragmentary cross sectional elevation view, taken along the A-A' line of FIG. 1, illustrating the semiconductor device in a step, subsequent to the step of FIG. 18, involved in the method of forming the semiconductor device in accordance with one embodiment of the present invention.

As shown in FIG. 19, a first interlayer insulating film 55 is formed by CVD to cover the silicon nitride film 53. The first interlayer insulating film 55 may be, for example, a silicon oxide film including boron and phosphorus with a thickness of 400 nm. A surface of the first interlayer insulating film 55 is planarized by CMP.

Figure 20:
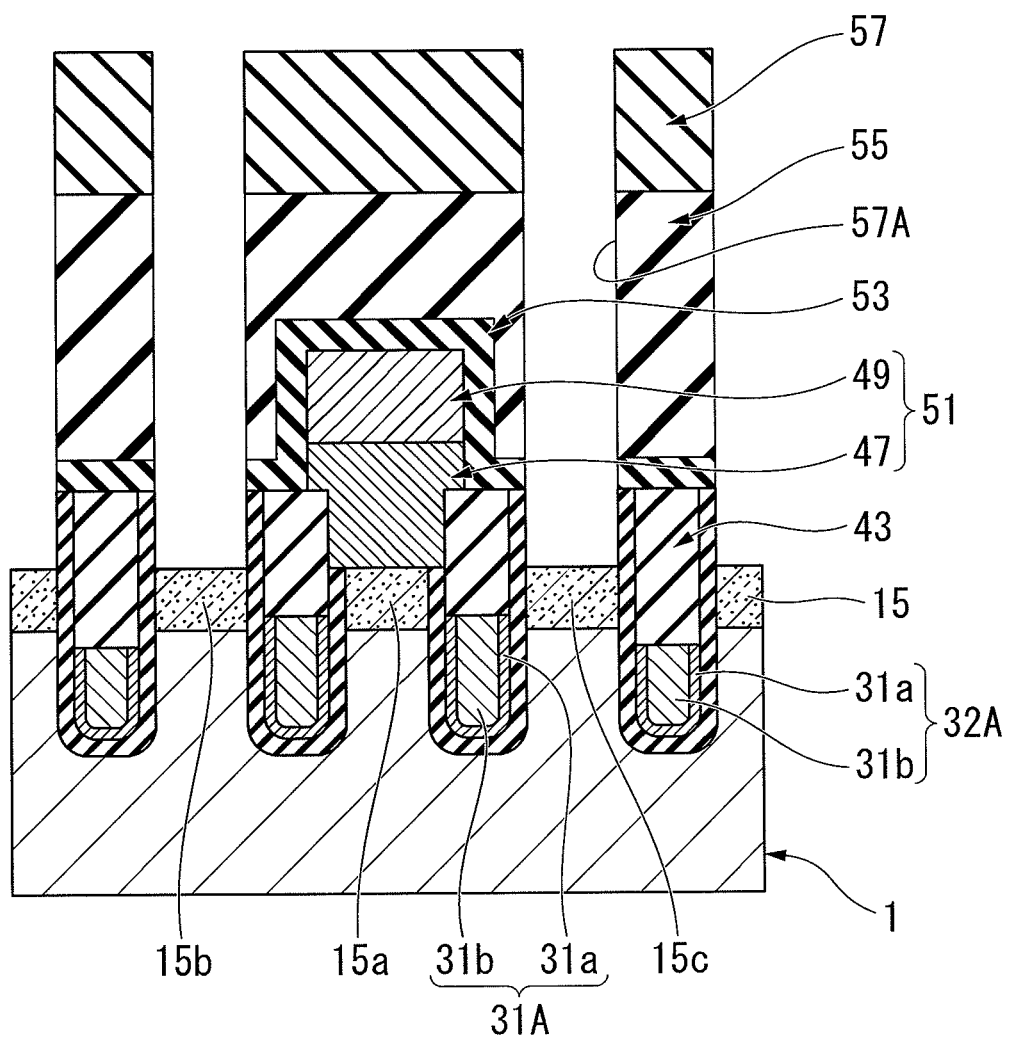
FIG. 20 is a fragmentary cross sectional elevation view, taken along the A-A' line of FIG. 1, illustrating the semiconductor device in a step, subsequent to the step of FIG. 19, involved in the method of forming the semiconductor device in accordance with one embodiment of the present invention.

As shown in FIG. 20, the contact hole 57A is formed. A contact hole pattern is formed by the known lithography technique. Then, an anisotropic dry etching process using the contact hole pattern as a mask is performed, thereby etching the first interlayer insulating film 55. The contact hole 57A through which the second n-type impurity diffusion layer 15b is shown is formed.

Figure 21:
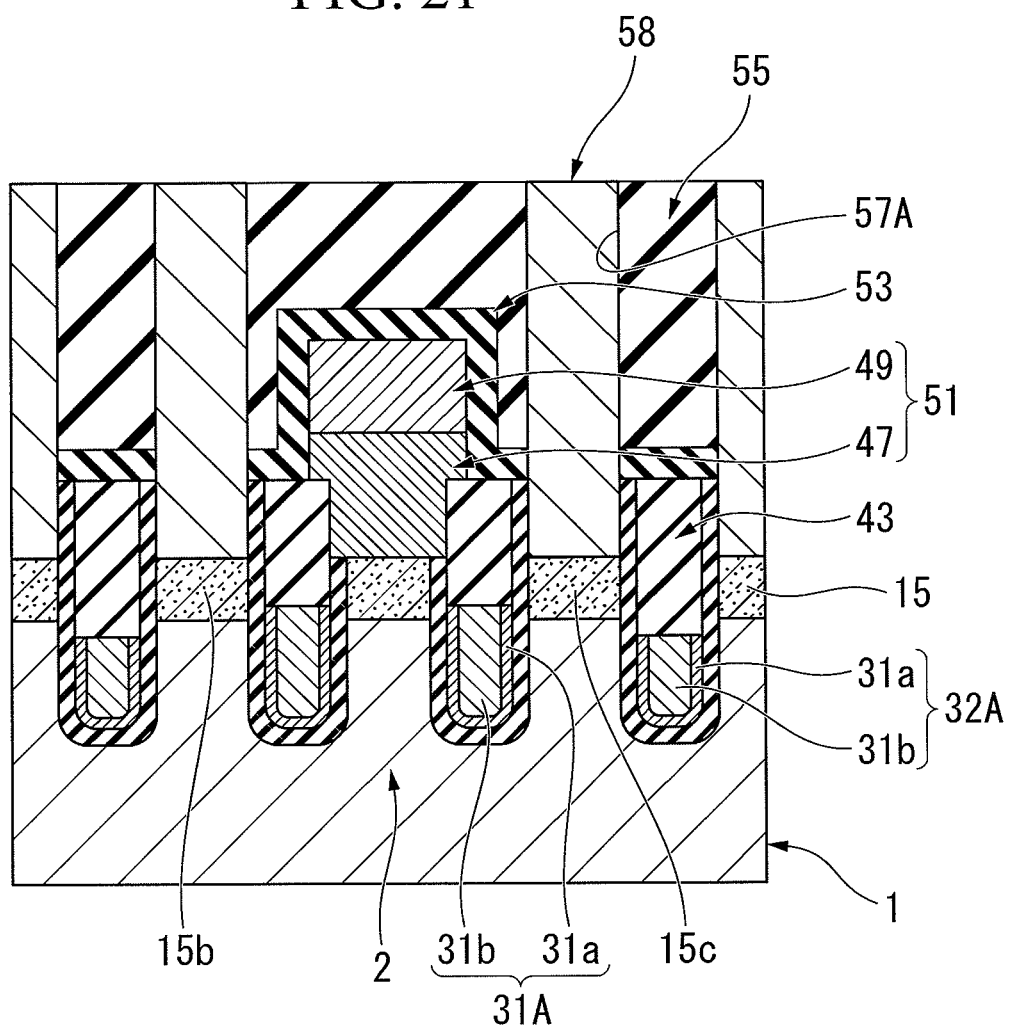
FIG. 21 is a fragmentary cross sectional elevation view, taken along the A-A' line of FIG. 1, illustrating the semiconductor device in a step, subsequent to the step of FIG. 20, involved in the method of forming the semiconductor device in accordance with one embodiment of the present invention.

As shown in FIG. 21, the contact plug 58 is formed. For example, a polysilicon doped with phosphorus at a concentration of $1\times10^{20}$ atoms/cm$^3$ is formed by LP-CVD to fill the contact hole 57A and cover the first interlayer insulating film 55.

Part of the polysilicon film on the first interlayer insulating film 55 is polished and removed by CMP. Thereby, the contact plug 58 connected to the second n-type impurity diffusion layer 15b is formed. A material for the contact plug 58 is not limited to polysilicon. The contact plug 58 may be formed of a metal material such as tungsten. When the contact plug 58 is formed of the metal material, a resistance of the contact plug 58 can be reduced and the DRAM can operate at a high speed. When the metal material is used as the material for the contact plug 58, a barrier layer which is a lamination of a silicide layer and metal nitride layer should be provided on the top surface of the second n-type impurity diffusion layer 15b which is connected to the contact plug 58.

Figure 22:
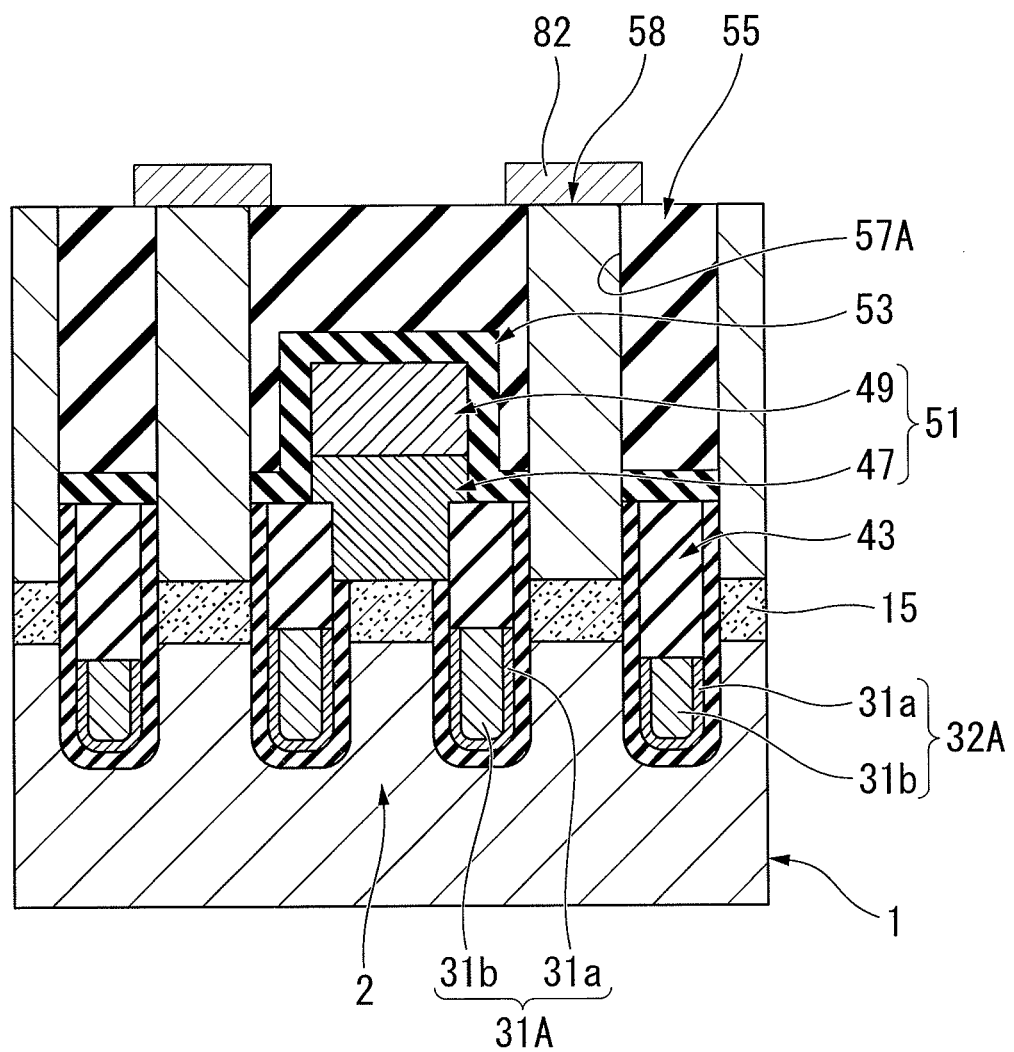
FIG. 22 is a fragmentary cross sectional elevation view, taken along the A-A' line of FIG. 1, illustrating the semiconductor device in a step, subsequent to the step of FIG. 21, involved in the method of forming the semiconductor device in accordance with one embodiment of the present invention.

As shown in FIG. 22, the capacitor contact pad 82 is formed. A tungsten nitride (WN) film and a tungsten (W) film are sequentially laminated to cover the first interlayer insulating film 55 and the contact plug 58. Then, the tungsten nitride film and the tungsten film are patterned. The capacitor contact pad 82 connected to the contact plug 58 is formed. At this time, the capacitor contact pad 82 should be formed at equal intervals in each memory cells illustrated in FIG. 1. Therefore, the capacitor contact pad 82 is preferably formed in a position deviated from a position located immediately above the contact plug 58.

Figure 23:
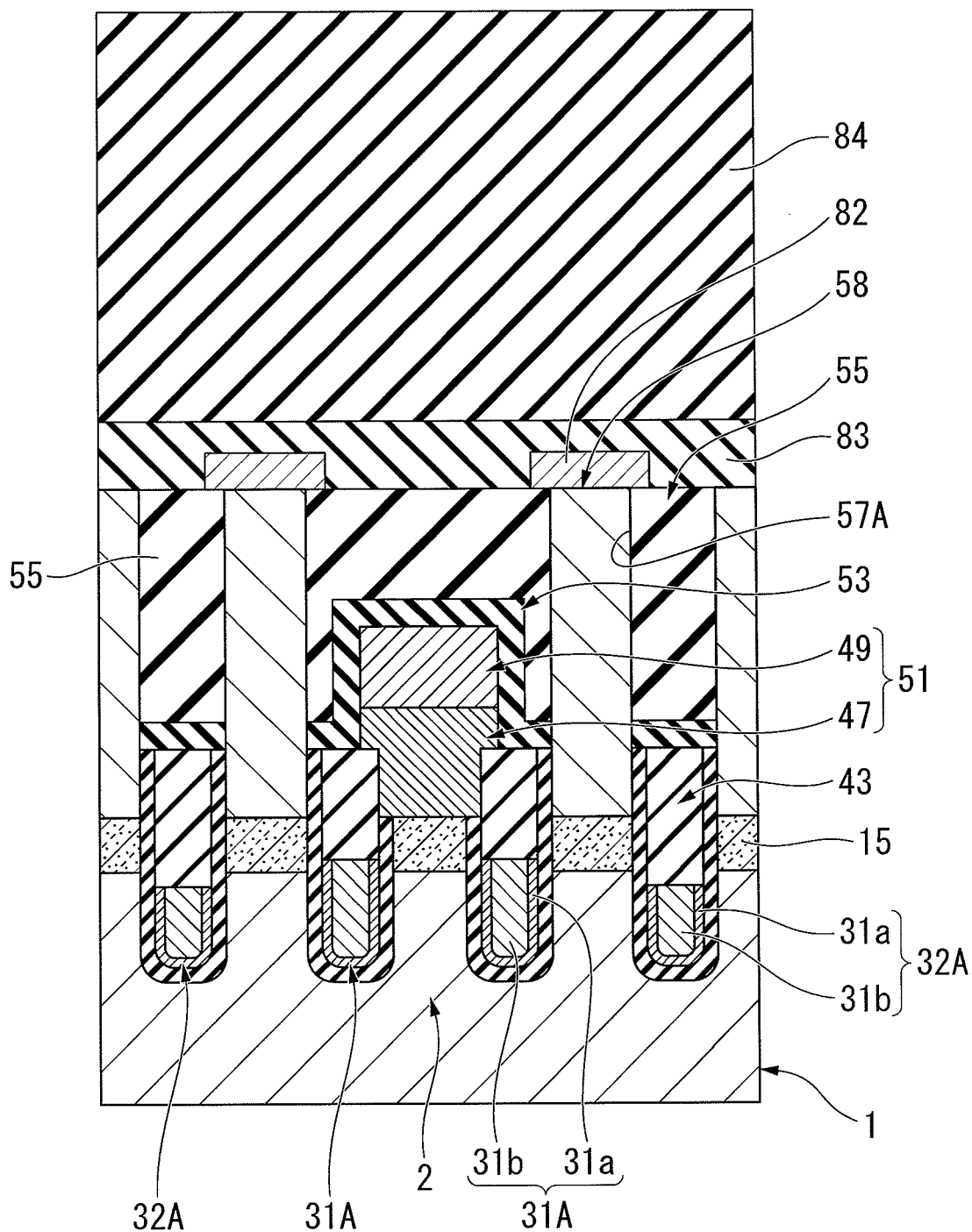
FIG. 23 is a fragmentary cross sectional elevation view, taken along the A-A' line of FIG. 1, illustrating the semiconductor device in a step, subsequent to the step of FIG. 22, involved in the method of forming the semiconductor device in accordance with one embodiment of the present invention.

As shown in FIG. 23, the second interlayer insulating film 83 formed of, for example, a silicon nitride film is formed to cover the first interlayer insulating film 55 and the capacitor contact pad 82. Then, the third interlayer insulating film 84 formed of, for example, a silicon oxide film is formed to cover the second interlayer insulating film 83.

Figure 24:
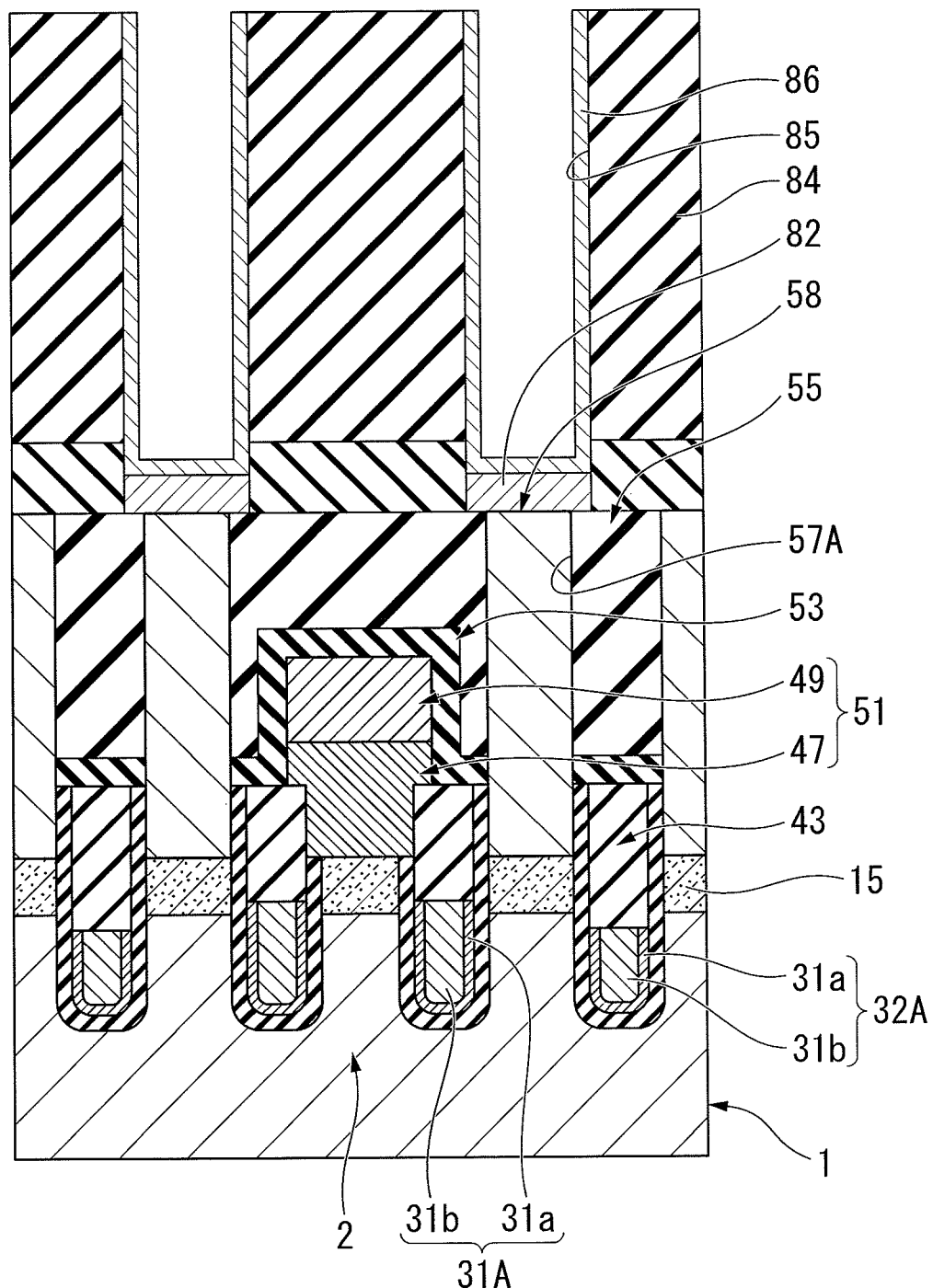
FIG. 24 is a fragmentary cross sectional elevation view, taken along the A-A' line of FIG. 1, illustrating the semiconductor device in a step, subsequent to the step of FIG. 23, involved in the method of forming the semiconductor device in accordance with one embodiment of the present invention.

As shown in FIG. 24, the first electrode 86 which functions as a lower electrode of the capacitor 8 is formed. A contact hole 85 penetrating the second interlayer insulating film 83 and the first interlayer insulating film 55 is formed, thereby showing a top surface of the capacitor contact pad 82. Then, the first electrode 86 formed of, for example, titanium nitride is formed to cover an inner surface of the contact hole 85 and the top surface of the capacitor contact pad 82. By this structure, a bottom of the first electrode 86 is connected to the top surface of the capacitor contact pad 82.

Figure 25:
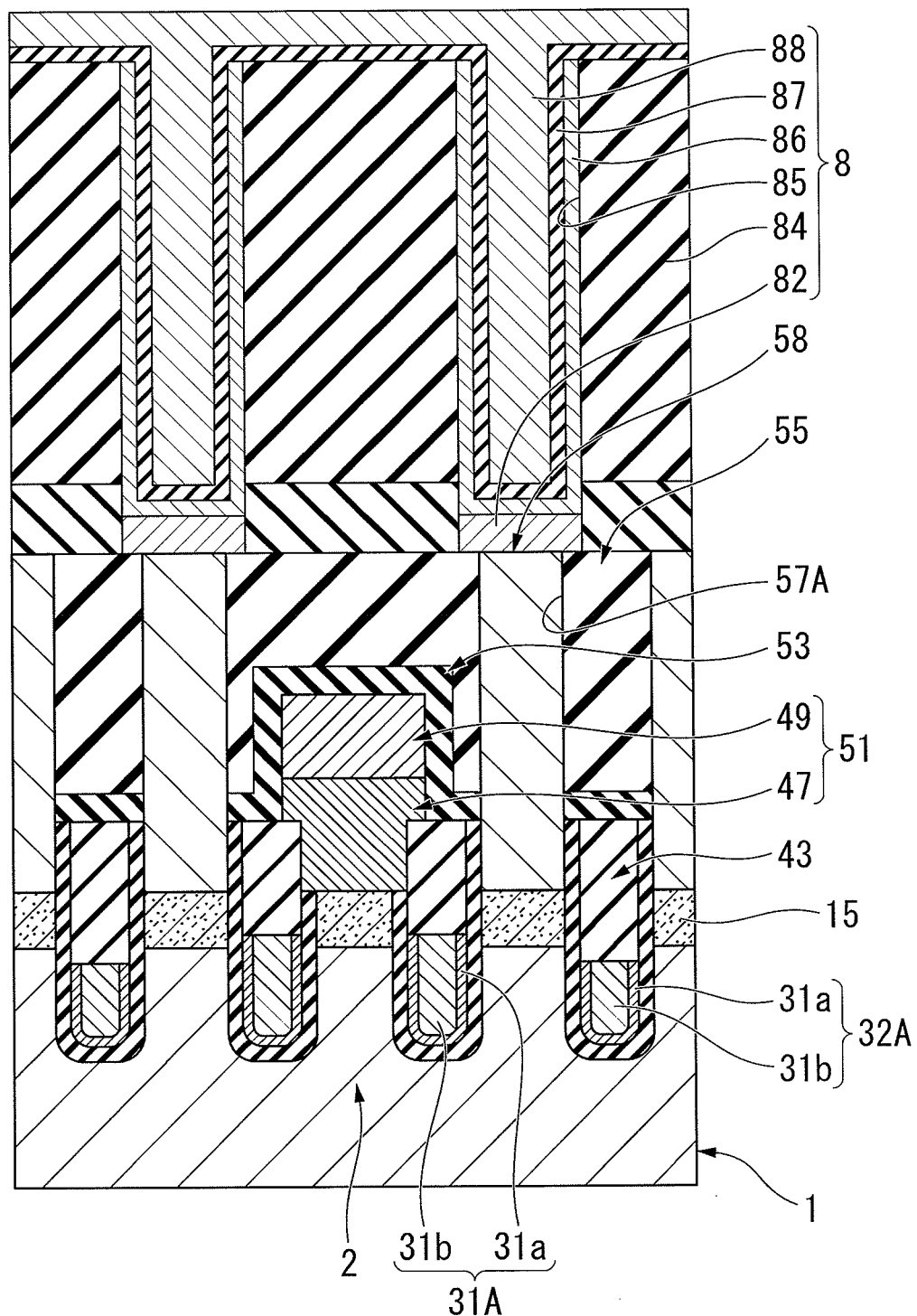
FIG. 25 is a fragmentary cross sectional elevation view, taken along the A-A' line of FIG. 1, illustrating the semiconductor device in a step, subsequent to the step of FIG. 24, involved in the method of forming the semiconductor device in accordance with one embodiment of the present invention.

As shown in FIG. 25, the capacitor 8 is formed. The capacitive insulating film 87 is formed to cover an inner wall surface of the first electrode 86 and the third interlayer insulating film 84. As the capacitive insulating film 87, a zirconium oxide ($ZrO_2$) film, an aluminum oxide ($Al_2O_3$) film, a hafnium oxide ($HfO_2$), or a lamination film thereof can be used. The second electrode 88 formed of, for example, titanium nitride is formed to cover the surface of the capacitive insulating film 87 and the third interlayer insulating film 84. The second electrode 88 functions as the upper electrode of the capacitor 8. Thereby, the capacitor 8 connected to the capacitor contact pad 82 is formed.

Figure 26:
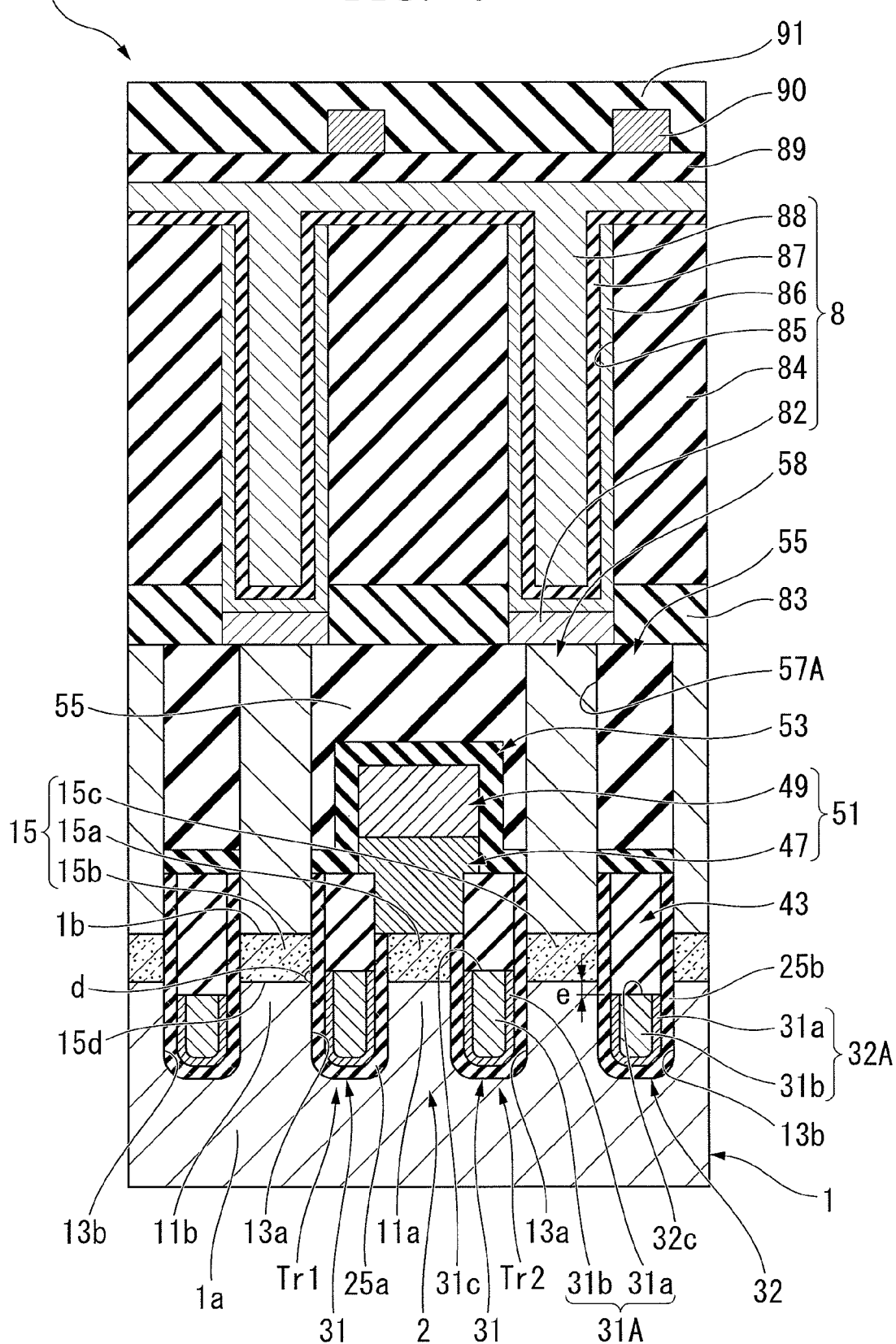
FIG. 26 is a fragmentary cross sectional elevation view, taken along the A-A' line of FIG. 1, illustrating the semiconductor device in a step, subsequent to the step of FIG. 25, involved in the method of forming the semiconductor device in accordance with one embodiment of the present invention.

As shown in FIG. 26, the wiring 90 is formed. The third insulating film 89 is formed to cover the capacitor 8. The wiring 90 formed of, for example, aluminum (Al) or copper (Cu) is formed on the third interlayer insulating film 89. The protective film 91 is formed to cover the wiring layer 90. As described above, the semiconductor device 10 according to the present embodiment is formed.

According to the method for forming the semiconductor device 10 of the present embodiment, the top surface 32c of the second conductive layer 32A which functions as the dummy gate electrode 32 is etched-back so that the top surface 32c is at a lower level than the junction position 15d of the n-type impurity diffusion layer 15. By the etching-back process, the top surface 32c of the second conductive layer 32A can be separated from the junction position 15d in the depth direction. Therefore, the side surface of the dummy gate electrode 32 can be prevented from facing the side surface of the n-type impurity diffusion layer 15 while the second gate insulating film 25b is interposed between the dummy gate electrode 32 and the n-type impurity diffusion layer 15. Therefore, an increase of the electric field intensity between the dummy gate electrode 32 and the n-type impurity diffusion layer 15 can be suppressed, thereby suppressing an increase of a junction leak current in the n-type impurity diffusion layer 15. Therefore, information storing properties of the DRAM are improved.

By etching back the top surface 32c so that the top surface 32c is at level that is at least 20 nm lower than the junction position 15d, the top surface 32c can be prevented from being formed at a higher level than the junction position 15d even if the etching amount of the top surface 32c is varied.

The top surface 31c of the gate electrode 31 is formed at a higher level than the junction position 15d of the n-type impurity diffusion layer 15. Therefore, an increase in the channel resistance is prevented, thereby improving the current driving properties of the transistor 2. The deterioration of the information storing properties derived from a miniaturization of the semiconductor device 10 can be prevented.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware that is constructed to carry out the desired function.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

What is claimed is:

1. A semiconductor device comprising:
   a semiconductor substrate having a top portion, a bottom portion, and first and second grooves;
   a gate electrode in the first groove;
   a dummy gate electrode in the second groove, the dummy gate electrode having a first top surface;
   a first impurity diffusion layer in the top portion of the semiconductor substrate between the first and second grooves, the first top surface being positioned at a lower level than a bottom of the first impurity diffusion layer;
   a cap insulating film covering the first top surface of the dummy gate electrode and a second top surface of the gate electrode and burying the first and second grooves, the cap insulating film including an upper portion that extends upwardly from an upper surface of the semiconductor substrate, the upper portion having a narrower width than that of the first groove; and
   a gate insulating film including first, second and third portions and covering an inner surface of the second groove, the first portion being sandwiched between the dummy gate electrode and the bottom portion of the semiconductor substrate, the second portion being sandwiched between the cap insulating film and the bottom portion of the semiconductor substrate, and the third portion being sandwiched between the cap insulating film and the first impurity diffusion layer, wherein
   the gate insulating film includes a fourth portion that covers an inner surface of the first groove, and
   the fourth portion of the gate insulating film includes a first end portion and a second end portion, a top surface of the first end portion being located above the upper surface of the semiconductor substrate, and a top surface of the second end portion being located below the top surface of the first end portion and above the second top surface of the gate electrode.

2. The semiconductor device according to claim 1, wherein the bottom of the first impurity diffusion layer has a p-n junction with the semiconductor substrate.

3. The semiconductor device according to claim 1, wherein the second top surface is positioned at a higher level than the bottom of the first impurity diffusion layer.

4. The semiconductor device according to claim 1, wherein the first top surface is positioned at level that is at least 20 nm lower than the bottom of the first impurity diffusion layer.

5. The semiconductor device according to claim 1, further comprising:
   a second impurity diffusion layer adjacent to the first groove and in the semiconductor substrate.

6. The semiconductor device according to claim 5, further comprising:

a bit line coupled to the second impurity diffusion layer.

7. The semiconductor device according to claim 1, further comprising:
a capacitor coupled to the first impurity diffusion layer.

8. A semiconductor device comprising:
a semiconductor substrate having a top portion and a bottom portion;
a first transistor including a first gate electrode and first and second impurity diffusion layers, the first gate electrode being buried in the semiconductor substrate;
a second transistor including a second gate electrode, the second impurity diffusion layer, and a third impurity diffusion layer, the second gate electrode being buried in the semiconductor substrate, the first, second and third impurity diffusion layers being in the top portion of the semiconductor substrate;
first and second dummy gate electrodes buried in the semiconductor substrate, the first and second dummy gate electrodes being adjacent to the first and third impurity diffusion layers, respectively, the first and second gate electrodes being interposed between the first and second dummy gate electrodes, a top surface of the first dummy gate electrode being positioned at a lower level than a bottom of the first impurity diffusion layer, and a top surface of the second dummy gate electrode being positioned at a lower level than a bottom of the third impurity diffusion layer;
a cap insulating film covering each top surface of the first and second dummy gate electrodes and buried in the semiconductor substrate, the cap insulating film including an upper portion that extends upwardly from an upper surface of the semiconductor substrate, the upper portion having the same width as the first gate electrode; and
a gate insulating film including first, second and third portions, the gate insulating film covering the semiconductor substrate and the first and third impurity diffusion layers,
wherein the first portion is sandwiched between at least the first dummy gate electrode and the bottom portion of the semiconductor substrate, the second portion is sandwiched between the cap insulating film and the bottom portion of the semiconductor substrate, and the third portion is sandwiched at least between the first dummy gate electrode and the first impurity diffusion layer,
the gate insulating film includes a fourth portion that covers the second impurity diffusion layer, and
the fourth portion of the gate insulating film includes a first end portion and a second end portion, a top surface of the first end portion being located above the upper surface of the semiconductor substrate, and a top surface of the second end portion being located below the top surface of the first end portion and above a top surface of the first gate electrode.

9. The semiconductor device according to claim 8, wherein the bottom of the first impurity diffusion layer and the bottom of the second impurity diffusion layer have p-n junctions with the semiconductor substrate.

10. The semiconductor device according to claim 8, wherein the top surface of the first gate electrode is positioned at a higher level than the bottom of the first impurity diffusion layer,
wherein a top surface of the second gate electrode is positioned at a higher level than the bottom of the third impurity diffusion layer.

11. The semiconductor device according to claim 8, wherein the top surface of the first dummy gate electrode is positioned at level that is at least 20 nm lower than the bottom of the first impurity diffusion layer, and
wherein the top surface of the second dummy gate electrode is positioned at level that is at least 20 nm lower than the bottom of the third impurity diffusion layer.

12. The semiconductor device according to claim 8, further comprising:
a bit line coupled to the second impurity diffusion layer.

13. The semiconductor device according to claim 12, further comprising:
a first capacitor coupled to the first impurity diffusion layer; and
a second capacitor coupled to the third impurity diffusion layer.

14. A semiconductor device comprising:
a first transistor including a first gate electrode and a first impurity diffusion layer;
a semiconductor substrate formed under the first impurity diffusion layer;
a second transistor including a second gate electrode;
a dummy gate electrode between the first and second transistors, the first impurity diffusion layer being disposed between the first gate electrode and the dummy gate electrode, a top surface of the dummy gate electrode being positioned at a lower level than a bottom of the first impurity diffusion layer;
a cap insulating film covering the top surface of the dummy gate electrode and buried in the semiconductor substrate, the cap insulating film including an upper portion that extends upwardly from an upper surface of the semiconductor substrate, the upper portion having the same width as the dummy gate electrode; and
a gate insulating film including first, second and third portions, the gate insulating film covering the semiconductor substrate and the first impurity diffusion layer,
wherein the first portion is sandwiched between the dummy gate electrode and the semiconductor substrate, the second portion is sandwiched between the cap insulating film and the semiconductor substrate, and the third portion is sandwiched between the first dummy gate electrode and the first impurity diffusion layer,
the gate insulating film includes a fourth portion, and
the fourth portion of the gate insulating film includes a first end portion and a second end portion, a top surface of the first end portion being located above the upper surface of the semiconductor substrate, and a top surface of the second end portion being located below the top surface of the first end portion and above a top surface of the first gate electrode.

15. The semiconductor device according to claim 14, wherein the top surface of the first gate electrode is positioned at a higher level than the bottom of the first impurity diffusion layer.

16. The semiconductor device according to claim 14, wherein the top surface of the dummy gate electrode is positioned at level that is at least 20 nm lower than the bottom of the first impurity diffusion layer.

17. The semiconductor device according to claim 14, wherein the second transistor further comprises:
a second impurity diffusion layer between the second gate electrode and the dummy gate electrode, and the top surface of the dummy gate electrode being positioned at a lower level than a bottom of the second impurity diffusion layer.

18. The semiconductor device according to claim 14, further comprising:

an insulator on the dummy gate electrode, the insulator electrically isolating the first and second transistors.

19. The semiconductor device according to claim 1, wherein the cap insulating film and the semiconductor substrate are laterally adjacent to each other via the second portion of the gate insulating film.

20. The semiconductor device according to claim 8, wherein the cap insulating film and the semiconductor substrate are laterally adjacent to each other via the second portion of the gate insulating film.

* * * * *